United States Patent
Ma et al.

(10) Patent No.: US 9,551,208 B2
(45) Date of Patent: Jan. 24, 2017

(54) IDENTIFYING UNCERTAINTY ASSOCIATED WITH A STIMULATED RESERVOIR VOLUME (SRV) CALCULATION

(71) Applicant: Halliburton Energy Services, Inc., Houston, TX (US)

(72) Inventors: Jianfu Ma, Sugar Land, TX (US); Avi Lin, Houston, TX (US); Harold Grayson Walters, Tomball, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 680 days.

(21) Appl. No.: 14/010,023

(22) Filed: Aug. 26, 2013

(65) Prior Publication Data

US 2015/0057934 A1 Feb. 26, 2015

(51) Int. Cl.
  *G01V 1/40* (2006.01)
  *E21B 43/26* (2006.01)
  *E21B 43/16* (2006.01)
  *G01V 1/28* (2006.01)

(52) U.S. Cl.
  CPC ............... *E21B 43/26* (2013.01); *E21B 43/16* (2013.01); *G01V 1/288* (2013.01)

(58) Field of Classification Search
  CPC .... G01V 99/005; G01V 1/00; G01V 2210/66; E21B 49/00; G06F 17/5009; G06T 17/05
  See application file for complete search history.

(56) References Cited

U.S. PATENT DOCUMENTS

| | | | |
|---|---|---|---|
| 7,869,954 B2 | 1/2011 | Den Boer et al. | |
| 8,386,226 B2 | 2/2013 | Craig | |
| 8,392,165 B2 | 3/2013 | Craig et al. | |
| 8,437,962 B2 | 5/2013 | Craig | |
| 2007/0272407 A1 | 11/2007 | Lehman et al. | |
| 2008/0004847 A1 | 1/2008 | Bradford | |
| 2008/0133186 A1 | 6/2008 | Li et al. | |
| 2010/0307755 A1 | 12/2010 | Xu et al. | |
| 2010/0312529 A1 | 12/2010 | Souche et al. | |
| 2011/0029291 A1 | 2/2011 | Weng et al. | |
| 2011/0029293 A1 | 2/2011 | Petty et al. | |
| 2011/0120702 A1 | 5/2011 | Craig | |
| 2011/0120705 A1 | 5/2011 | Walters et al. | |

(Continued)

FOREIGN PATENT DOCUMENTS

WO WO 2012/141720 10/2012

OTHER PUBLICATIONS

Agarwal et al., "Impact of Geomechanics on Microseismicity" SPE 152835, SPE/EAGE European Unconventional Resources Conference and Exhibition, Vienna, Austria, Mar. 20-22, 2012, 16 pages.

(Continued)

*Primary Examiner* — Elias Desta
(74) *Attorney, Agent, or Firm* — John W. Wustenberg; Parker Justiss, P.C.

(57) ABSTRACT

In some aspects, first and second boundaries are computed based on locations of microseismic events associated with a stimulation treatment of a subterranean region. Based on the first and second boundaries, an uncertainty associated with a stimulated reservoir volume (SRV) for the stimulation treatment is identified. The first and second boundaries are defined in a common spatial domain and at least a portion of the second boundary resides outside the first boundary.

22 Claims, 21 Drawing Sheets

(56) References Cited

U.S. PATENT DOCUMENTS

| | | | |
|---|---|---|---|
| 2011/0120706 A1 | 5/2011 | Craig | |
| 2011/0120718 A1 | 5/2011 | Craig | |
| 2011/0209868 A1 | 9/2011 | Dusterhoft et al. | |
| 2011/0213602 A1 | 9/2011 | Dasari et al. | |
| 2012/0318500 A1 | 12/2012 | Urbancic et al. | |
| 2013/0081805 A1* | 4/2013 | Bradford | G01V 1/40 166/250.1 |
| 2013/0144532 A1* | 6/2013 | Williams | G01V 1/50 702/11 |
| 2013/0231910 A1* | 9/2013 | Kumar | G06F 19/00 703/10 |
| 2013/0304437 A1* | 11/2013 | Ma | G06F 17/5009 703/2 |

OTHER PUBLICATIONS

Bowman and Urbancic, "Determining Effective Hydraulic Fracture Volume Utilizing PSO and Seismic Deformation," Frontiers + Innovation, 2009, 2 pages.

Cheng, "Impacts of the Number of Perforation Clusters and Cluster Spacing on Production Performance of Horizontal Shale-Gas Wells?" SPE 138843, SPE Eastern Regional Meeting, Morgantown West Virginia, Oct. 12-14, 2010, 10 pages.

Cipolla et al., "Hydraulic Fracture Monitoring to Reservoir Simulation: Maximizing Value," SPEC 133877, SPE Annual Technical Conference and Exhibition, Florence, Italy, Sep. 19-22, 2010, 26 pages.

Craig, "Using Maps of Microseismic Events to Define Reservoir Discontinuities," SPE 135290, SPE Annual Technical Conference and Exhibition, Florence, Italy, Sep. 19-22, 2010, 8 pages.

Maxwell et al., "Enhanced Reservoir Characterization Using Hydraulic Fracture Microseismicity," SPE 140442, SPE Hydraulic Fracturing Technology Conference and Exhibition, Woodlands, Texas, USA, Jan. 24-26, 2011, 11 pages.

Mayerhofer et al., "What is Stimulated Reservoir Volume?" SPE 119890, SPE Shale Gas Production Conference, Fort Worth, Texas, USA, Nov. 16-18, 2008, 10 pages.

U.S. Appl. No. 13/646,093, titled "Analyzing Fracture Stratigraphy," filed Oct. 5, 2012, Williams et al., 39 pages.

U.S. Appl. No. 13/792,772, titled "Updating Microseismic Histogram Data," filed Mar. 11, 2013, Lin, 67 pages.

U.S. Appl. No. 13/861,986, titled, "Identifying Orientation Clusters From Microseismic Data," filed Apr. 12, 2013, Lin, 65 pages.

U.S. Appl. No. 13/896,389, titled "Analyzing Microseismic Data From a Fracture Treatment," filed May 17, 2013, Ma et al., 50 pages.

U.S. Appl. No. 13/896,394, titled "Determining a Confidence Value for a Fracture Plane," filed May 17, 2013, Lin et al., 42 pages.

U.S. Appl. No. 13/896,400, titled "Geometrical Presentation of Fracture Planes," filed May 17, 2013, Ma et al., 49 pages.

U.S. Appl. No. 13/896,406, titled "Managing Microseismic Data for Fracture Matching," filed May 17, 2013, Lin, 46 pages.

U.S. Appl. No. 13/896,425, titled "Propagating Fracture Plane Updates," filed May 17, 2013, Lin, 58 pages.

U.S. Appl. No. 13/896,617, titled "Identifying Fracture Planes From Microseismic Data," filed May 17, 2013, Ma et al., 40 pages.

U.S. Appl. No. 13/896,792, titled "Identifying Dominant Fracture Orientations," May 17, 2013, Ma et al., 50 pages.

U.S. Appl. No. 13/975,985, titled "Identifying a Simulated Reservoir Volume from Microseismic Data," filed Aug. 26, 2013, Ma et al., 88 pages.

U.S. Appl. No. 14/010,029, titled "Real-time Stimulated Reservoir Volume Calculation," filed Aug. 26, 2013, Ma et al., 87 pages.

U.S. Appl. No. 14/010,056, titled "Identifying Overlapping Stimulated Reservoir Volumes for a Multi-Stage Injection Treatment," filed Aug. 26, 2013, Ma et al., 88 pages.

U.S. Appl. No. 14/010,079, titled "Identifying an Axis of a Stimulated Reservoir Volume for a Stimulation Treatment of a Subterranean Region," filed Aug. 26, 2013, Ma et al., 88 pages.

Warpinski, "Microseismic: Inside and Out," J Pet Technical, Nov. 2009, 61(11):80-85.

Williams et al., "Quantitative interpretation of major planes from microseismic event locations with application in production prediction" 2010 SEG Annual Meeting, Oct. 17-22, 2010, Denver, Colorado, pp. 2085-2089.

Zimmer "Calculating Stimulated Reservoir Volume (SRV) with Consideration of Uncertainties in Microseismic-Event Locations," CSUG/SPE 148610, Canadian Unconventional Resources Conference, Nov. 15-17, 2011, Calgary, Alberta, Canada, 13 pages.

Zimmer et al., "Microseismic Monitoring Quality-Control (QC) Reports as an Interpretative Tool for Nonspecialists," SPE 110517, 2007 SPE Annual Technical Conference and Exhibition, Nov. 11-14, 2007, Anaheim, California, 7 pages.

Wolfram Mathworld, "Ellipsoid," Aug. 2011, 3 pages; <http://mathworld.wolfram.com/Ellipsoid.html>.

* cited by examiner

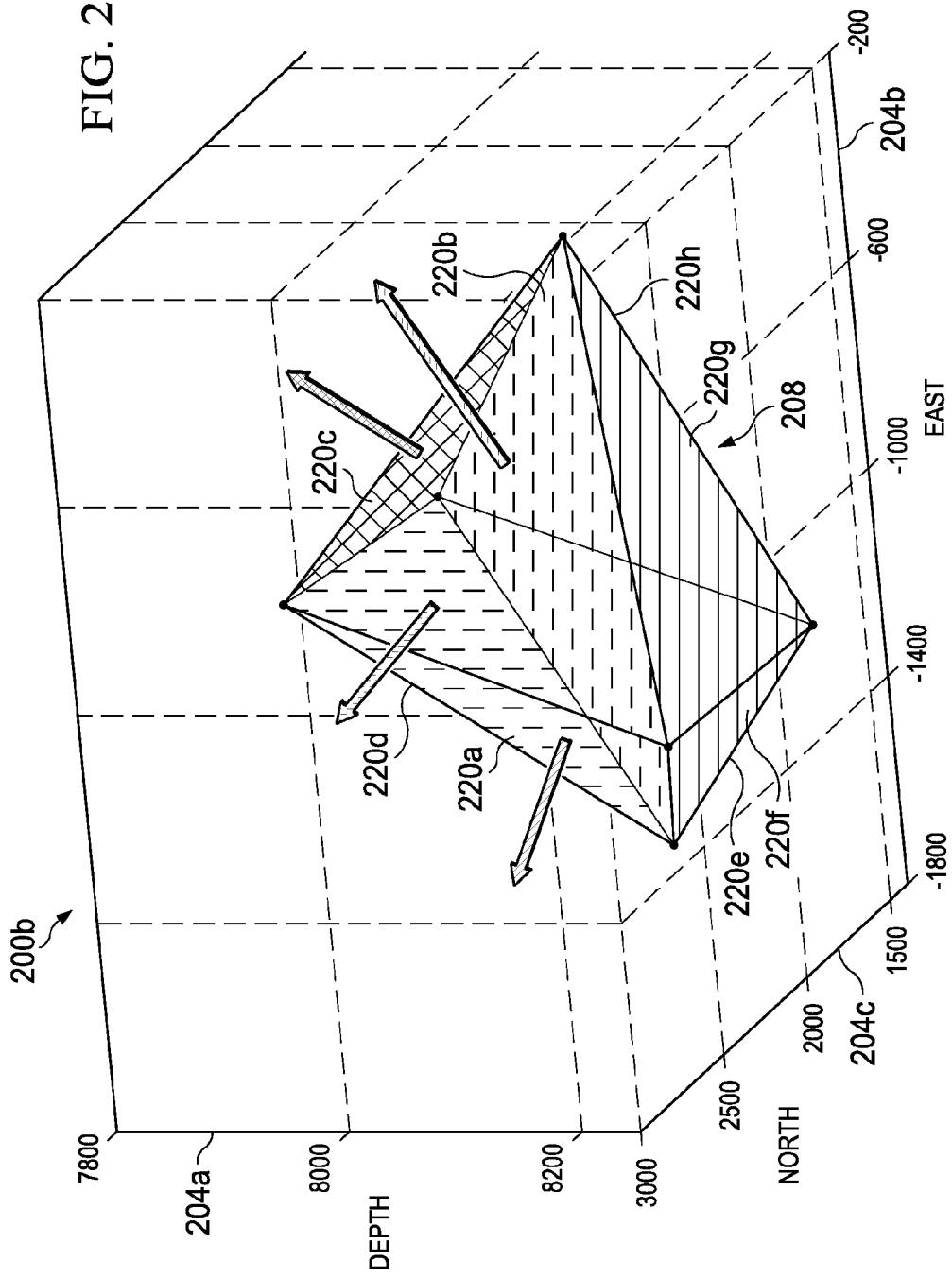

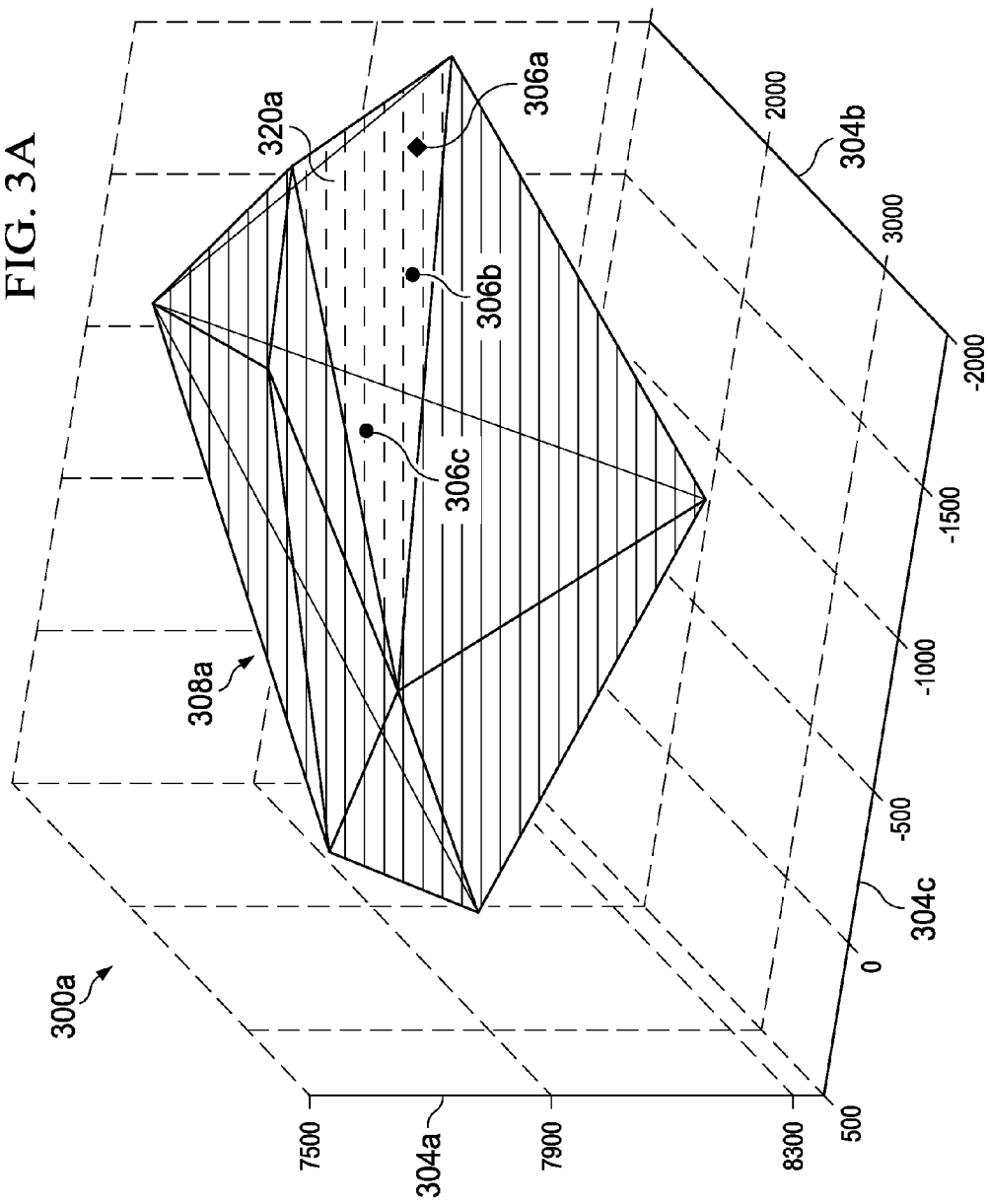

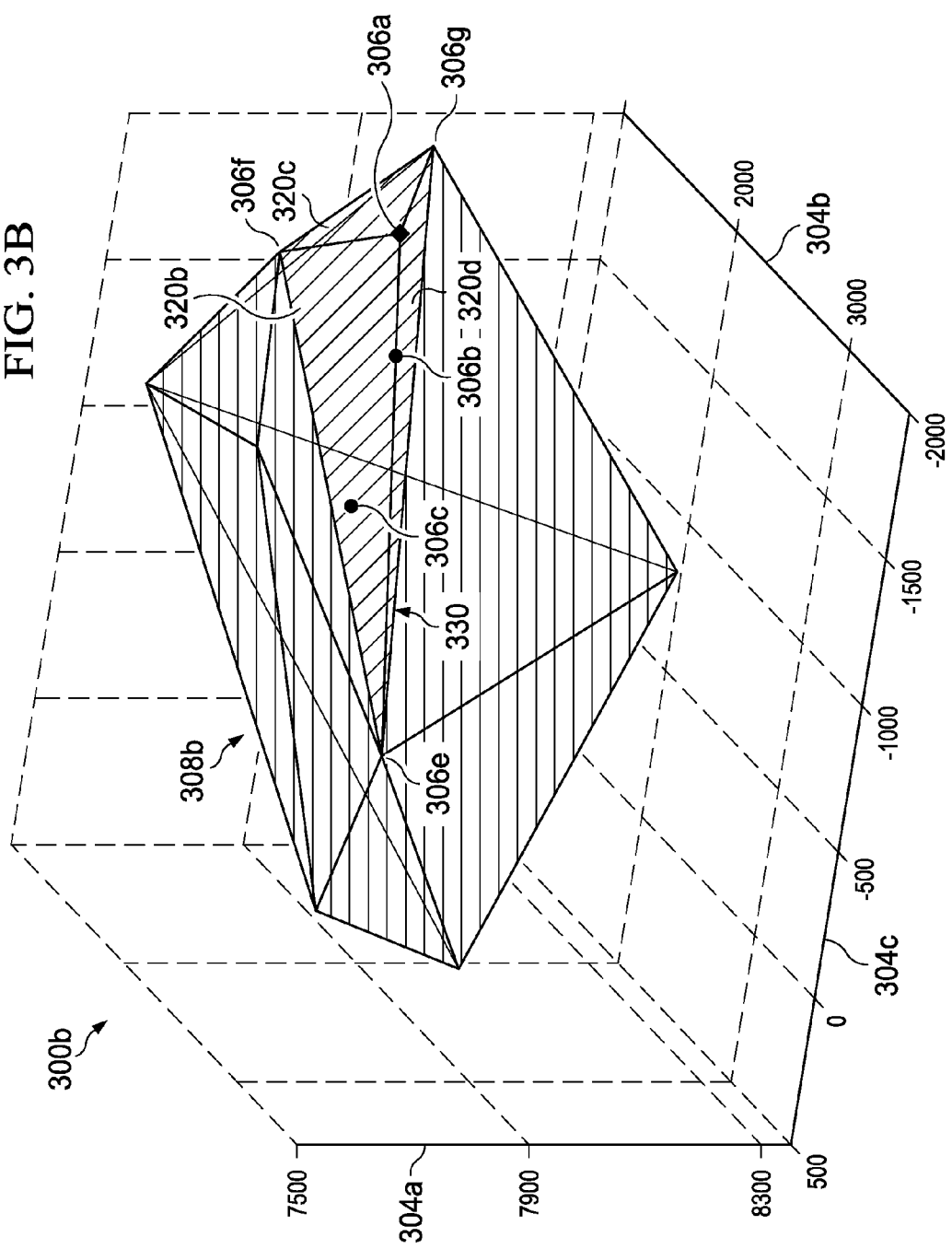

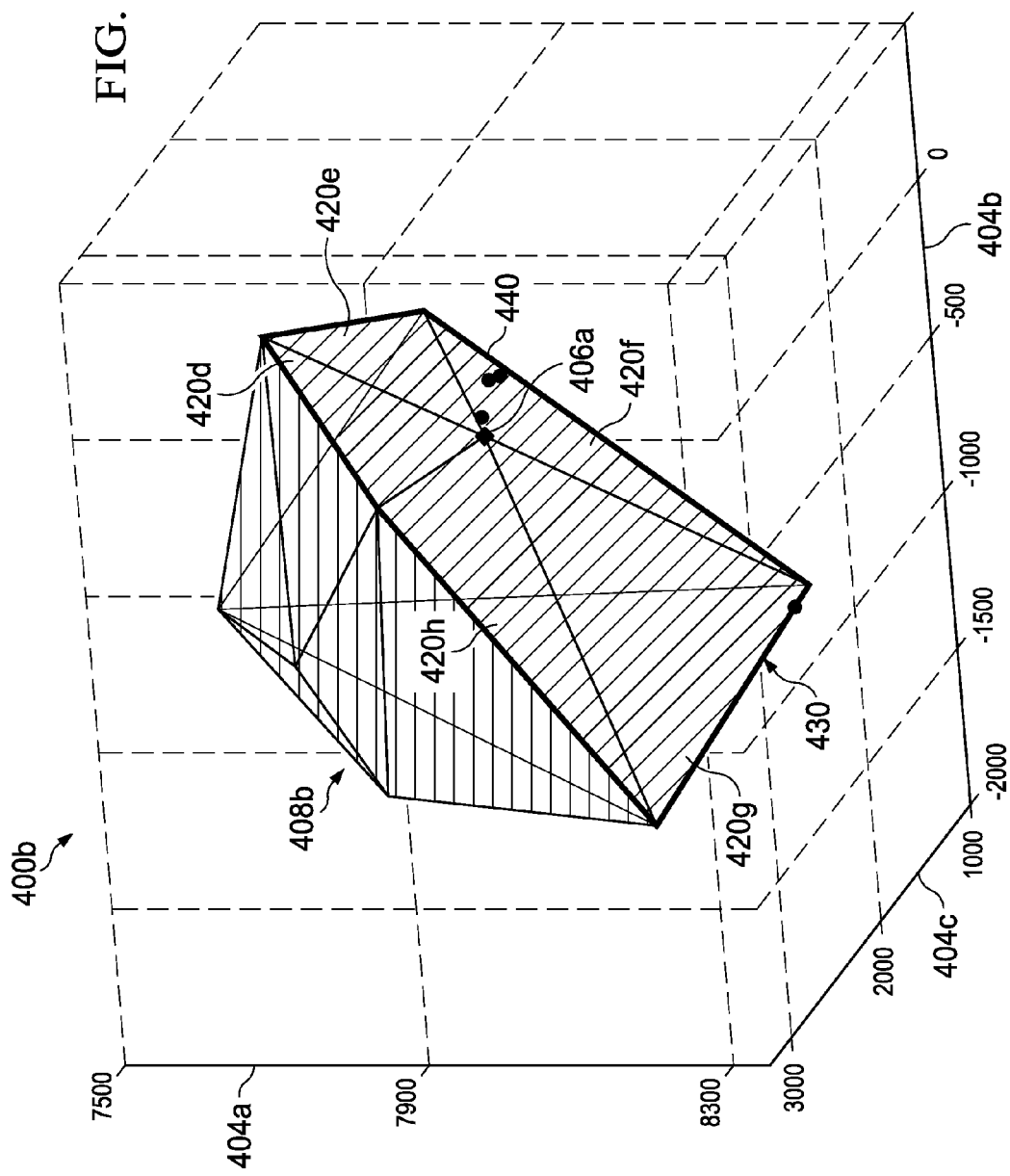

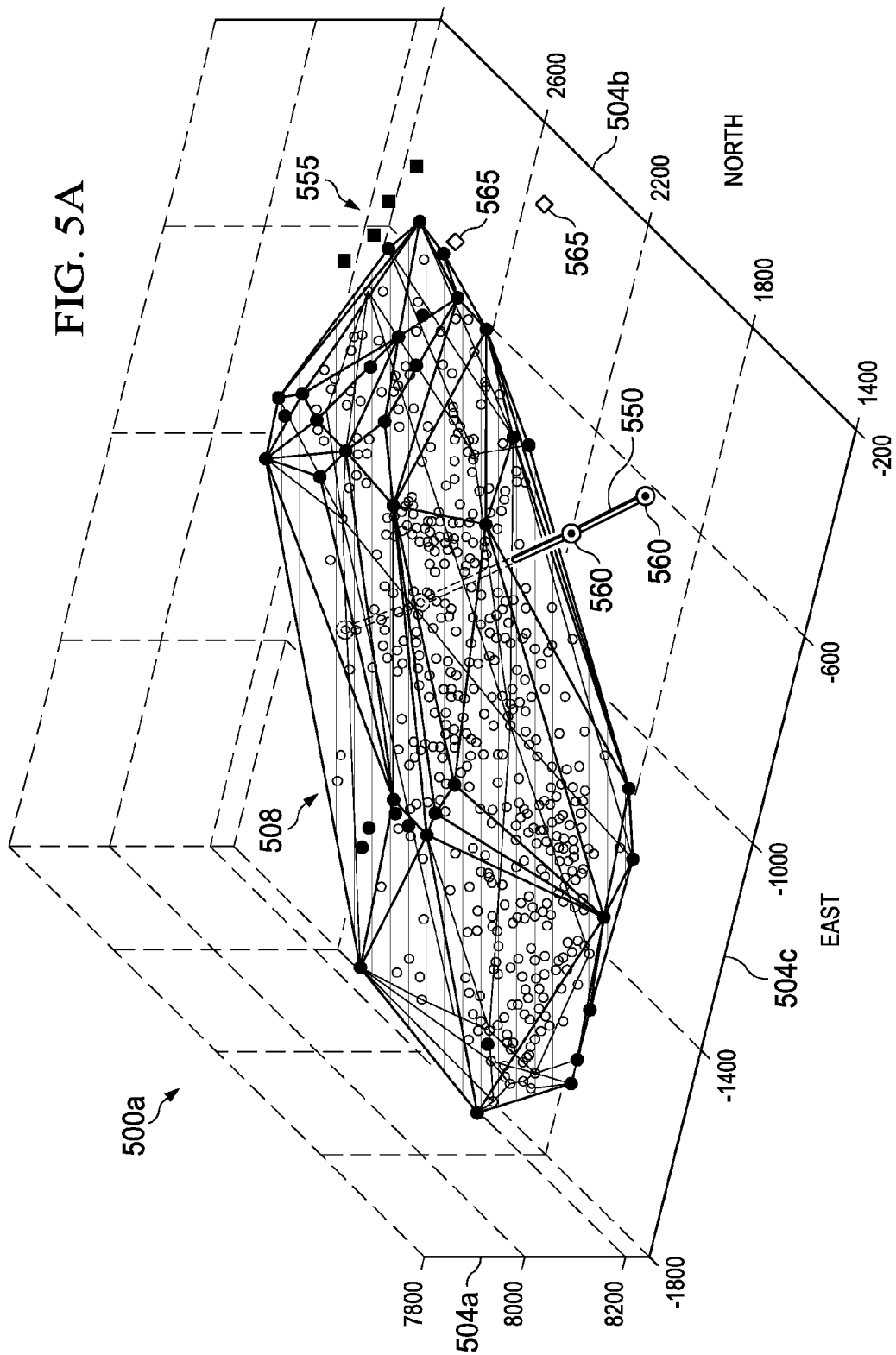

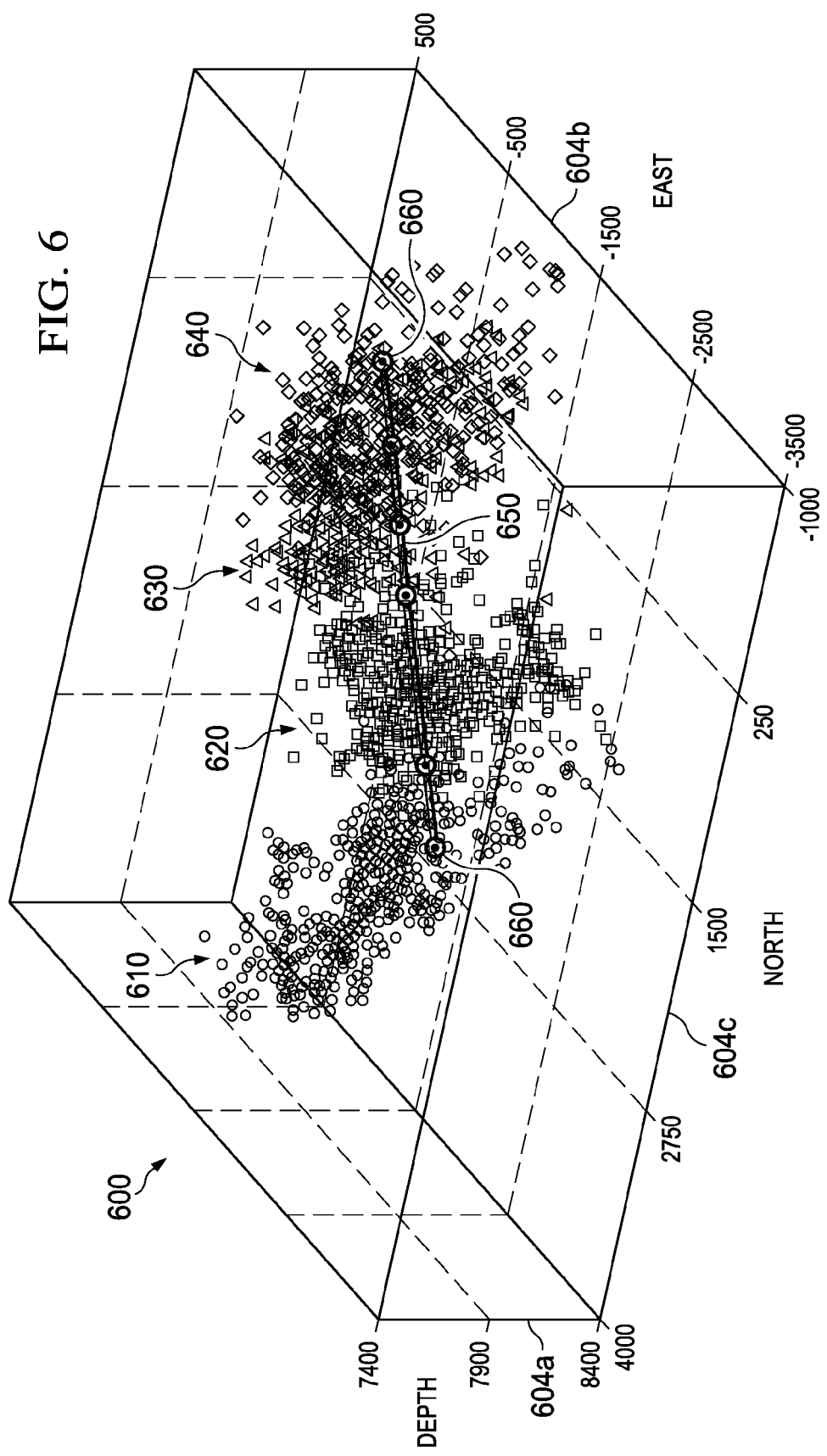

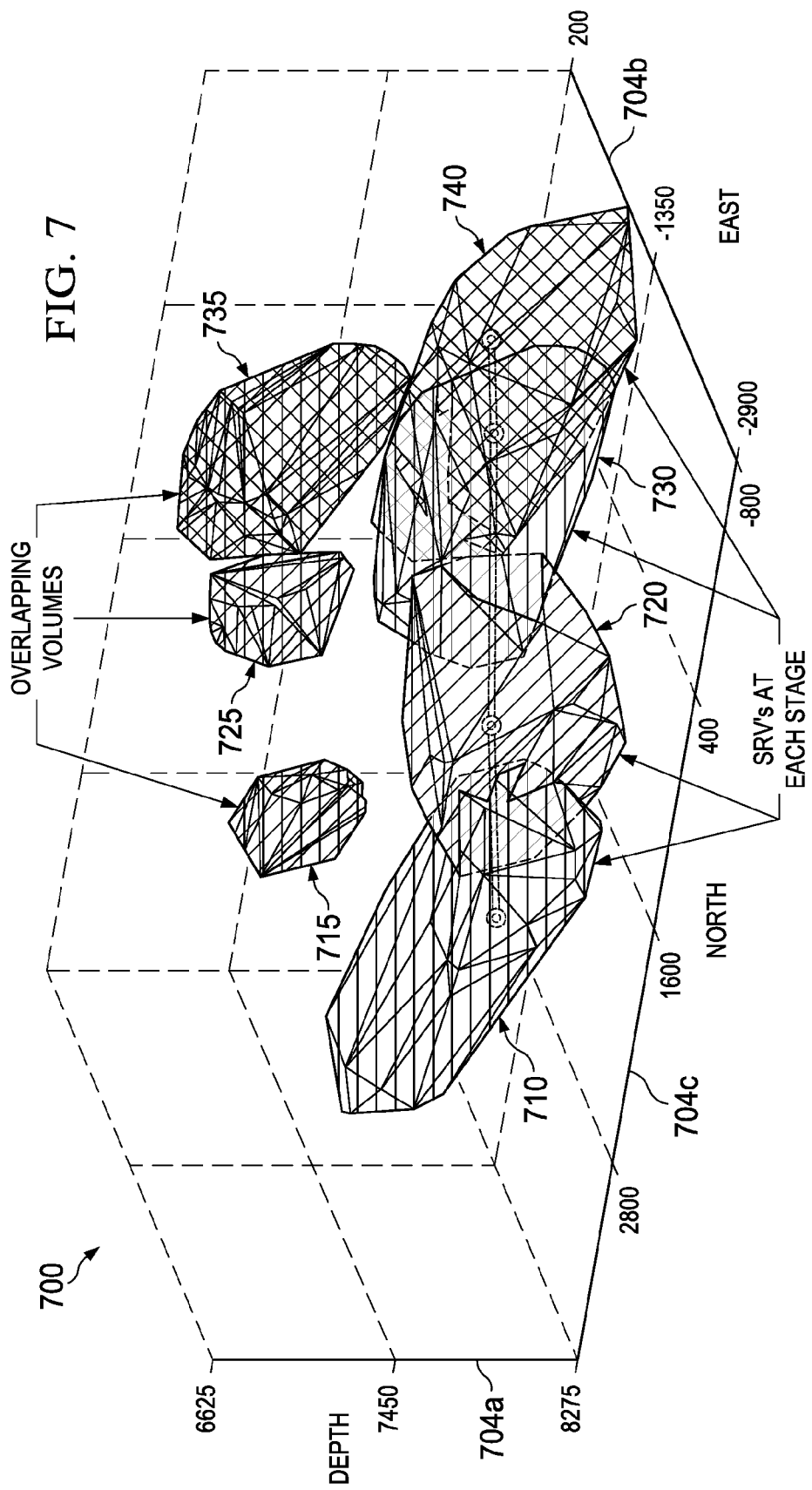

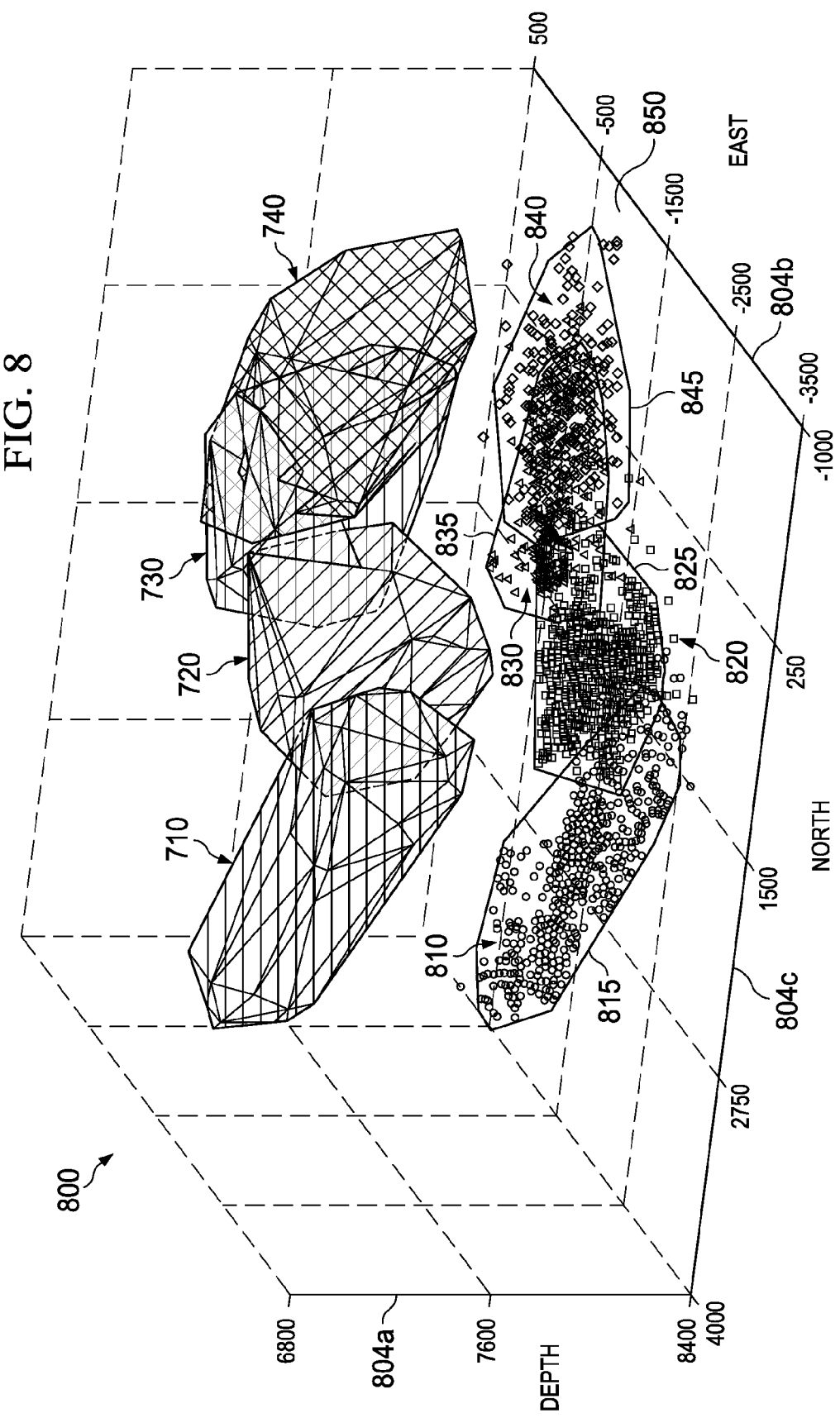

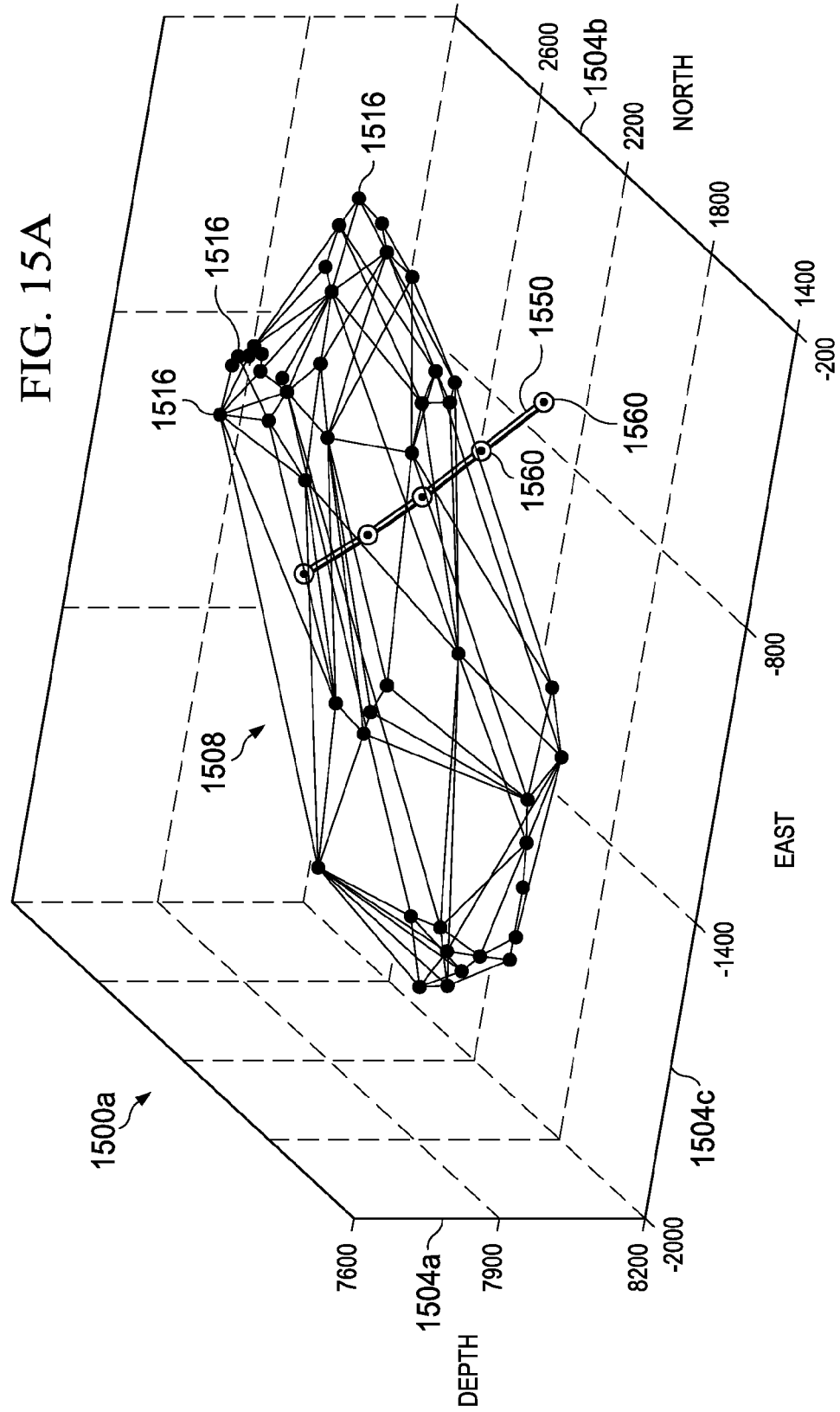

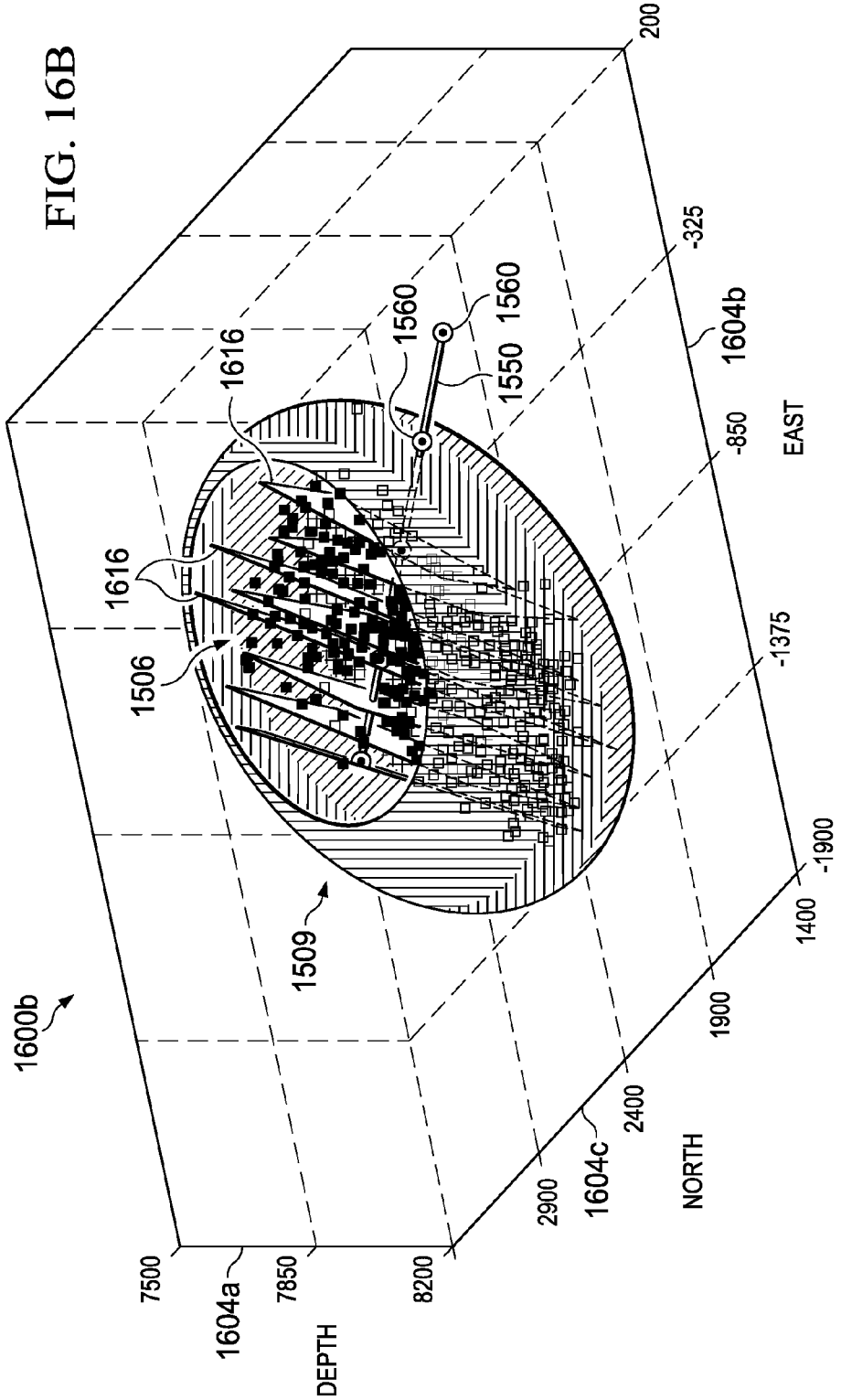

IDENTIFYING UNCERTAINTY ASSOCIATED WITH A STIMULATED RESERVOIR VOLUME (SRV) CALCULATION

BACKGROUND

The following description relates to identifying a stimulated reservoir volume (SRV) for a stimulation treatment of a subterranean region. Microseismic data are often acquired in association with injection treatments applied to a subterranean formation. The injection treatments are typically applied to induce fractures in the subterranean formation, and to thereby enhance hydrocarbon productivity of the subterranean formation. The pressures generated by the stimulation treatment can induce low-amplitude or low-energy seismic events in the subterranean formation, and the events can be detected by sensors and collected for analysis.

DESCRIPTION OF DRAWINGS

FIG. 2B is another plot showing the example boundary 208 from FIG. 2A.

FIG. 3A is a plot showing an example of a boundary and microseismic data; FIG. 3B is a plot showing an updated version of the example boundary 308a from FIG. 3A.

FIG. 4B is a plot showing an updated version of the example boundary 408a from FIG. 4A.

FIG. 5A is a plot showing an example of a boundary and microseismic data.

FIG. 6 is a plot showing example microseismic event data collected from a multi-stage injection treatment.

FIG. 7 is a plot showing a three-dimensional representation of overlapping stimulated reservoir volumes (SRVs) associated with respective stages of a multi-stage injection treatment.

FIG. 8 is a plot showing a two-dimensional representation of the overlapping SRVs shown in the plot 700 in FIG. 7.

FIG. 15A is a plot showing an example of a boundary and its vertices.

FIG. 16B is a plot showing another view of the example visualization 1600a in FIG. 16A.

Like reference symbols in the various drawings indicate like elements.

DETAILED DESCRIPTION

Figure 1A:
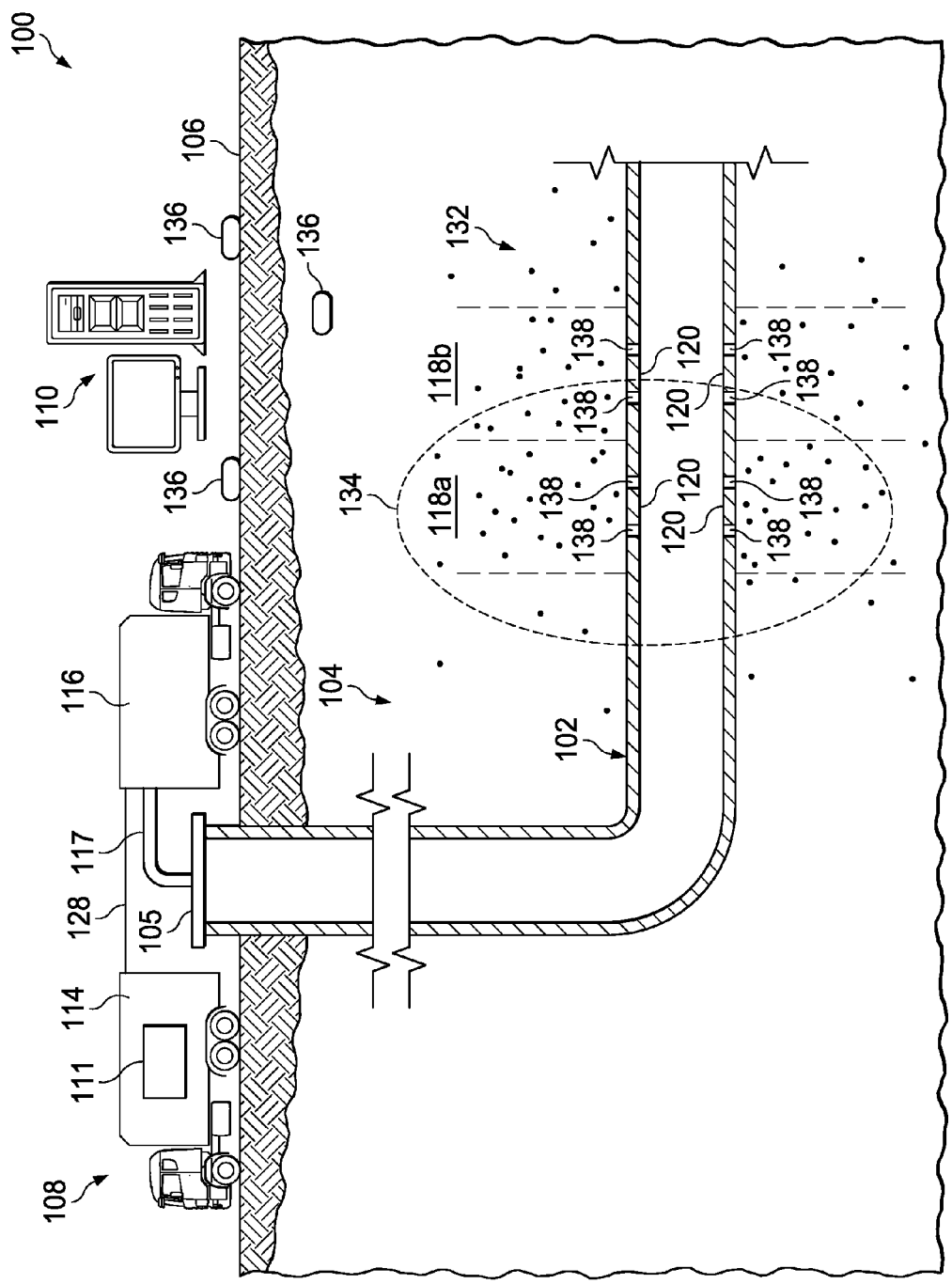
FIG. 1A is a schematic diagram of an example well system.

In some aspects of what is described here, a stimulated reservoir volume (SRV) for a stimulation treatment is approximated and calculated from microseismic data. In some instances, an SRV uncertainty, an SRV overlap, geometric properties of the SRV, or other types of information are adequately approximated based on calculations from the microseismic data. In some instances, these or other types of information are dynamically identified and displayed, for example, in a real-time fashion during a stimulation treatment. The stimulation treatment can include, for example, an injection treatment, a flow-back treatment, or another treatment. In some instances, the techniques described here can provide field engineers or others with a reliable and direct tool to visualize the stimulated reservoir geometry and treatment field development, to evaluate the efficiency of hydraulic fracturing treatments, to modify or otherwise manage a treatment plan, or to perform other types of analysis or design.

In some instances, the calculated SRV can be proportional to or otherwise indicate the volume of a subterranean region that was fractured, effectively stimulated, or otherwise affected by a stimulation treatment. For example, the calculated SRV may represent the volume in which fractures or fracture networks were created, dilated, or propagated by the stimulation treatment. In some instances, SRV can represent the volume of a subterranean region that was contacted by treatment fluid from the stimulation treatment. In some aspects, the calculated SRV can be obtained based on the volume of a cloud of microseismic events generated by the stimulation treatments. In some implementations, the calculated SRV can be used to evaluate the efficiency of an injection treatment and to assess treatment well performance. In some cases, a more consistent and accurate estimation or prediction of SRV can provide a useful tool for analyzing a stimulated reservoir.

In some implementations, microseismic data can be collected from a stimulation treatment, such as a multi-stage hydraulic fracturing treatment. Based on locations of the microseismic events, a geometrical representation of the SRV can be constructed, and a quantitative representation of the SRV can be calculated based on the geometrical representation. The geometrical representation can include, for example, a three-dimensional (3D) convex hull or a two-dimensional (2D) convex polygon enclosing some or all of the microseismic events. The geometrical representation can include plots, tables, charts, graphs, coordinates, vector data, maps or other geometrical objects. In some implementations, in addition to the volume of the SRV for the stimulated subterranean region, other geometric properties (e.g., a length, width, height, orientation) of the SRV can be identified based on the geometrical representation. The geometric properties can be used to characterize the stimulated subterranean region. For example, the geometrical representation can indicate an extension of hydraulic fractures in the stimulated subterranean formation. In some instances, a stimulated contact area can be identified, for example, by projecting 3D microseismic events onto a reference plane (e.g., a horizontal plane) or by another technique.

In some instances, due to low-amplitude or low-energy microseismic events or low signal-to-noise (SNR) measurements, some uncertainty can be associated with the data for each microseismic event. In some cases, the uncertainty associated with the microseismic events can be used to quantify the uncertainty of the calculated SRV. The uncertainty can include, for example, location, moment (e.g., energy or amplitude), time, or another type of uncertainty associated with the microseismic events. The uncertainty can reflect the accuracy of the SRV estimation. In some cases, the uncertainty can serve as a metric for injection treatment evaluation, treatment plan design, or other types of analysis.

In some implementations, for a multi-stage injection treatment, SRV can be identified for each distinct treatment stage. In some instances, the overlap in SRV between neighboring or geographically close stages can be extracted from the individual SRV of each stage. A total SRV can be derived for the multi-stage injection treatment based on the SRV for each stage, while accounting for the overlap. In some instances, the overlap in SRV between stages indicates fluid connection between hydraulic fractures created by each stage, and may imply diversion of treatment fluid during the hydraulic fracturing process. The extracted SRV overlap and the estimated communication can be used, for example, by field engineers to control the loss of treatment fluid in real-time fashion, to modify the treatment strategy, or otherwise manage the treatment plan. In some cases, the efficiency of a stimulation treatment can indicate the amount of the reservoir (e.g., the amount of the unfractured reservoir) contacted by a given fracture treatment. In some instances, the efficiency can be improved or maximized by reducing or minimizing SRV overlap between two adjacent injection stages. Improving fracturing efficiency via overlap reduction can help reduce costs or provide other benefits in some instances.

In some implementations, the geophysical geometry of the SRV at each stage, the overlapping volumes between adjacent stages, the stimulated contact area, or a combination of these and other types of information can be graphically displayed. The quantity of SRV at each stage, the accuracy or uncertainty of the SRV calculation, an estimate of overlapped volumes, a percentage of the overlapping volumes over the SRV of a treatment stage, or other appropriate quantities can be displayed or otherwise provided, for example, to help field engineers identify the efficiency of the treatment and possible communication between different stages, or other information.

Generally, the techniques described here can be performed at any time, for example, before, during, or after a treatment or other event. In some instances, the techniques described here can be implemented in real time, for example, during a stimulation treatment. Generating or presenting data in real-time may allow well operators or field engineers to visualize the temporal and spatial evolution of the SRV, dynamically identify the geometry of the SRV and control the development of the SRV to maximize the SRV and production. In some instances, physical connection or fluid communication between stimulated regions of multiple stages can be identified in real time and the treatment strategy can be adjusted in real time, for instance, to reduce or avoid loss of treatment fluid, to improve the efficiency of hydraulic fracturing efforts, or to enhance hydrocarbon productivity. In some instances, the real-time SRV analysis can be combined with real-time hydraulic fracture mapping, for example, to provide additional information about the hydraulic fracturing treatment.

FIG. 1A is a diagram of an example well system 100 with a computing subsystem 110. The example well system 100 includes a wellbore 102 in a subterranean region 104 beneath the ground surface 106. The example wellbore 102 shown in FIG. 1A includes a horizontal wellbore. However, a well system may include any combination of horizontal, vertical, slant, curved, or other wellbore orientations. The well system 100 can include one or more additional treatment wells, observation wells, or other types of wells.

The computing subsystem 110 can include one or more computing devices or systems located at the wellbore 102, or in other locations. The computing subsystem 110 or any of its components can be located apart from the other components shown in FIG. 1A. For example, the computing subsystem 110 can be located at a data processing center, a computing facility, or another suitable location. The well system 100 can include additional or different features, and the features of the well system can be arranged as shown in FIG. 1A or in another configuration.

The example subterranean region 104 may include a reservoir that contains hydrocarbon resources, such as oil, natural gas, or others. For example, the subterranean region 104 may include all or part of a rock formation (e.g., shale, coal, sandstone, granite, or others) that contain natural gas. The subterranean region 104 may include naturally fractured rock or natural rock formations that are not fractured to any significant degree. The subterranean region 104 may include tight gas formations of low permeability rock (e.g., shale, coal, or others).

The example well system 100 shown in FIG. 1A includes an injection system 108. The injection system 108 can be used to perform a stimulation treatment that includes, for example, an injection treatment and a flow back treatment. During an injection treatment, fluid is injected into the subterranean region 104 through the wellbore 102. In some instances, the injection treatment fractures part of a rock formation or other materials in the subterranean region 104. In such examples, fracturing the rock may increase the surface area of the formation, which may increase the rate at which the formation conducts fluid resources to the wellbore 102.

A fracture treatment can be applied at a single fluid injection location or at multiple fluid injection locations in a subterranean region, and the fluid may be injected over a single time period or over multiple different time periods. In some instances, a fracture treatment can use multiple different fluid injection locations in a single wellbore, multiple fluid injection locations in multiple different wellbores, or any suitable combination. Moreover, the fracture treatment can inject fluid through any suitable type of wellbore, such as, for example, vertical wellbores, slant wellbores, horizontal wellbores, curved wellbores, or any suitable combination of these and others.

The example injection system 108 can inject treatment fluid into the subterranean region 104 from the wellbore 102. The injection system 108 includes instrument trucks 114, pump trucks 116, and an injection treatment control subsystem 111. The example injection system 108 may include other features not shown in the figures. The injection system 108 may apply injection treatments that include, for example, a single-stage injection treatment, a multi-stage injection treatment, a mini-fracture test treatment, a follow-on fracture treatment, a re-fracture treatment, a final fracture treatment, other types of fracture treatments, or a combination of these.

The example injection system 108 in FIG. 1A uses multiple treatment stages or intervals 118a and 118b (collectively "stages 118"). The injection system 108 may delineate fewer stages or multiple additional stages beyond the two example stages 118 shown in FIG. 1A. The stages 118 may each have one or more perforation clusters 120. A perforation cluster can include one or more perforations 138. Fractures in the subterranean region 104 can be initiated at or near the perforation clusters 120 or elsewhere. The stages 118 may have different widths, or the stages 118 may be uniformly distributed along the wellbore 102. The stages 118 can be distinct, non-overlapping (or overlapping) injection zones along the wellbore 102. In some instances, each of the multiple treatment stages 118 can be isolated, for example, by packers or other types of seals in the wellbore 102. In some instances, each of the stages 118 can be treated individually, for example, in series along the extent of the wellbore 102. The injection system 108 can perform identical, similar, or different injection treatments at different stages.

The pump trucks 116 can include mobile vehicles, immobile installations, skids, hoses, tubes, fluid tanks, fluid reservoirs, pumps, valves, mixers, or other types of structures and equipment. The example pump trucks 116 shown in FIG. 1A can supply treatment fluid or other materials for the injection treatment. The pump trucks 116 may contain multiple different treatment fluids, proppant materials, or other materials for different stages of a stimulation treatment.

The example pump trucks 116 can communicate treatment fluids into the wellbore 102, for example, through a conduit, at or near the level of the ground surface 106. The treatment fluids can be communicated through the wellbore 102 from the ground surface 106 level by a conduit installed in the wellbore 102. The conduit may include casing cemented to the wall of the wellbore 102. In some implementations, all or a portion of the wellbore 102 may be left open, without casing. The conduit may include a working string, coiled tubing, sectioned pipe, or other types of conduit.

The instrument trucks 114 can include mobile vehicles, immobile installations, or other suitable structures. The example instrument trucks 114 shown in FIG. 1A include an injection treatment control subsystem 111 that controls or monitors the stimulation treatment applied by the injection system 108. The communication links 128 may allow the instrument trucks 114 to communicate with the pump trucks 116, or other equipment at the ground surface 106. Additional communication links may allow the instrument trucks 114 to communicate with sensors or data collection apparatus in the well system 100, remote systems, other well systems, equipment installed in the wellbore 102 or other devices and equipment.

The example injection treatment control subsystem 111 shown in FIG. 1A controls operation of the injection system 108. The injection treatment control subsystem 111 may include data processing equipment, communication equipment, or other systems that control stimulation treatments applied to the subterranean region 104 through the wellbore 102. The injection treatment control subsystem 111 may include or be communicably linked to a computing system (e.g., the computing subsystem 110) that can calculate, select, or optimize fracture treatment parameters for initialization, propagation, or opening fractures in the subterranean region 104. The injection treatment control subsystem 111 may receive, generate or modify a stimulation treatment plan (e.g., a pumping schedule) that specifies properties of a stimulation treatment to be applied to the subterranean region 104.

The stimulation treatment, as well as other activities and natural phenomena, can generate microseismic events in the subterranean region 104. In the example shown in FIG. 1A, the injection system 108 has caused multiple microseismic events 132 during a multi-stage injection treatment. A subset 134 of microseismic events are shown inside a circle. In some implementations, the subset 134 of microseismic events are events associated with a single treatment stage (e.g., treatment stage 118a) of a multi-stage injection treatment. In some implementations, the subset 134 of microseismic events can be identified based on the time that they occurred, and the subset 134 can be filtered or otherwise modified to exclude outliers or other event points. The subset 134 of microseismic events can be selected from a superset of microseismic events based on any suitable criteria. In some cases, the subset 134 of microseismic events are used to identify an SRV for the stage 118a or another aspect of an injection treatment.

The microseismic event data can be collected from the subterranean region 104. For example, the microseismic data can be collected by one or more sensors 136 associated with the injection system 108, or the microseismic data can be collected by other types of systems. The microseismic information detected in the well system 100 can include acoustic signals generated by natural phenomena, acoustic signals associated with a stimulation treatment applied through the wellbore 102, or other types of signals. For instance, the sensors may detect acoustic signals generated by rock slips, rock movements, rock fractures or other events in the subterranean region 104. In some instances, the locations of individual microseismic events can be determined based on the microseismic data. Microseismic events in the subterranean region 104 may occur, for example, along or near induced hydraulic fractures. The microseismic events may be associated with pre-existing natural fractures or hydraulic fracture planes induced by fracturing activities.

The wellbore 102 shown in FIG. 1A can include sensors 136, microseismic array, and other equipment that can be used to detect microseismic information. The sensors 136 may include geophones or other types of listening equipment. The sensors 136 can be located at a variety of positions in the well system 100. In FIG. 1A, sensors 136 are installed at the surface 106 and beneath the surface 106 (e.g., in an observation well (not shown)). Additionally or alternatively, sensors may be positioned in other locations above or below the surface 106, in other locations within the wellbore 102, or within another wellbore (e.g., another treatment well or an observation well). The wellbore 102 may include additional equipment (e.g., working string, packers, casing, or other equipment) not shown in FIG. 1A.

In some cases, all or part of the computing subsystem 110 can be contained in a technical command center at the well site, in a real-time operations center at a remote location, in another appropriate location, or any suitable combination of these. The well system 100 and the computing subsystem 110 can include or access any suitable communication infrastructure. For example, well system 100 can include multiple separate communication links or a network of interconnected communication links. The communication links can include wired or wireless communications systems. For example, the sensors 136 may communicate with the instrument trucks 114 or the computing subsystem 110 through wired or wireless links or networks, or the instrument trucks 114 may communicate with the computing subsystem 110 through wired or wireless links or networks. The communication links can include a public data network, a private data network, satellite links, dedicated communication channels, telecommunication links, or any suitable combination of these and other communication links.

The computing subsystem 110 can analyze microseismic data collected in the well system 100. For example, the computing subsystem 110 may analyze microseismic event data from a stimulation treatment of a subterranean region 104. Microseismic data from a stimulation treatment can include data collected before, during, or after fluid injection. The computing subsystem 110 can receive the microseismic data at any suitable time. In some instances, the computing subsystem 110 receives the microseismic data in real time (or substantially in real time) during the fracture treatment. For example, the microseismic data may be sent to the computing subsystem 110 immediately upon detection by the sensors 136. In some instances, the computing subsystem 110 receives some or all of the microseismic data after the fracture treatment has been completed. The computing subsystem 110 can receive the microseismic data in any suitable format. For example, the computing subsystem 110 can receive the microseismic data in a format produced by microseismic sensors or detectors, or the computing subsystem 110 can receive the microseismic data after the microseismic data has been formatted, packaged, or otherwise processed. The computing subsystem 110 can receive the microseismic data, for example, by a wired or wireless communication link, by a wired or wireless network, or by one or more disks or other tangible media.

The computing subsystem 110 can perform, for example, fracture mapping and matching based on collected microseismic event data to identify fracture orientation trends and extract fracture network characteristics. The characteristics may include fracture orientation (e.g., azimuth and dip angle), fracture size (e.g., length, height, surface area), fracture spacing, fracture complexity, stimulated reservoir volume (SRV), or another property. In some implementations, the computing subsystem 110 can identify SRV for a stimulation treatment applied to the subterranean region 104, calculate an uncertainty of the SRV calculation, identify overlapping volume of SRV between stages of a stimulation treatment, or other information. The computing subsystem 110 can perform additional or different operations.

In one aspect of operation, the injection system 108 can perform an injection treatment, for example, by injecting fluid into the subterranean region 104 through the wellbore 102. The injection treatment can be, for example, a multi-stage injection treatment where an individual injection treatment is performed during each stage. The injection treatment can induce microseismic events in the subterranean region 104. Sensors (e.g., the sensors 136) or other detecting equipment in the well system 100 can detect the microseismic events, and collect and transmit the microseismic event data, for example, to the computing subsystem 110. The computing subsystem 110 can receive and analyze the microseismic event data. For instance, the computing subsystem 110 may identify an SRV or other data for the injection treatment based on the microseismic data. The SRV data may be computed for an individual stage or for the multi-stage treatment as a whole. In some instances, the computed SRV data can be presented to well operators, field engineers, or others to visualize and analyze the temporal and spatial evolution of the SRV. In some implementations, the microseismic event data can be collected, communicated, and analyzed in real time during an injection treatment. In some implementations, the computed SRV data can be provided to the injection treatment control subsystem 111. A current or a prospective treatment strategy can be adjusted or otherwise managed based on the computed SRV data, for example, to improve the efficiency of the injection treatment.

Some of the techniques and operations described here may be implemented by a computing subsystem configured to provide the functionality described. In various embodiments, a computing system may include any of various types of devices, including, but not limited to, personal computer systems, desktop computers, laptops, notebooks, mainframe computer systems, handheld computers, workstations, tablets, application servers, storage devices, computing clusters, or any type of computing or electronic device.

Figure 1B:
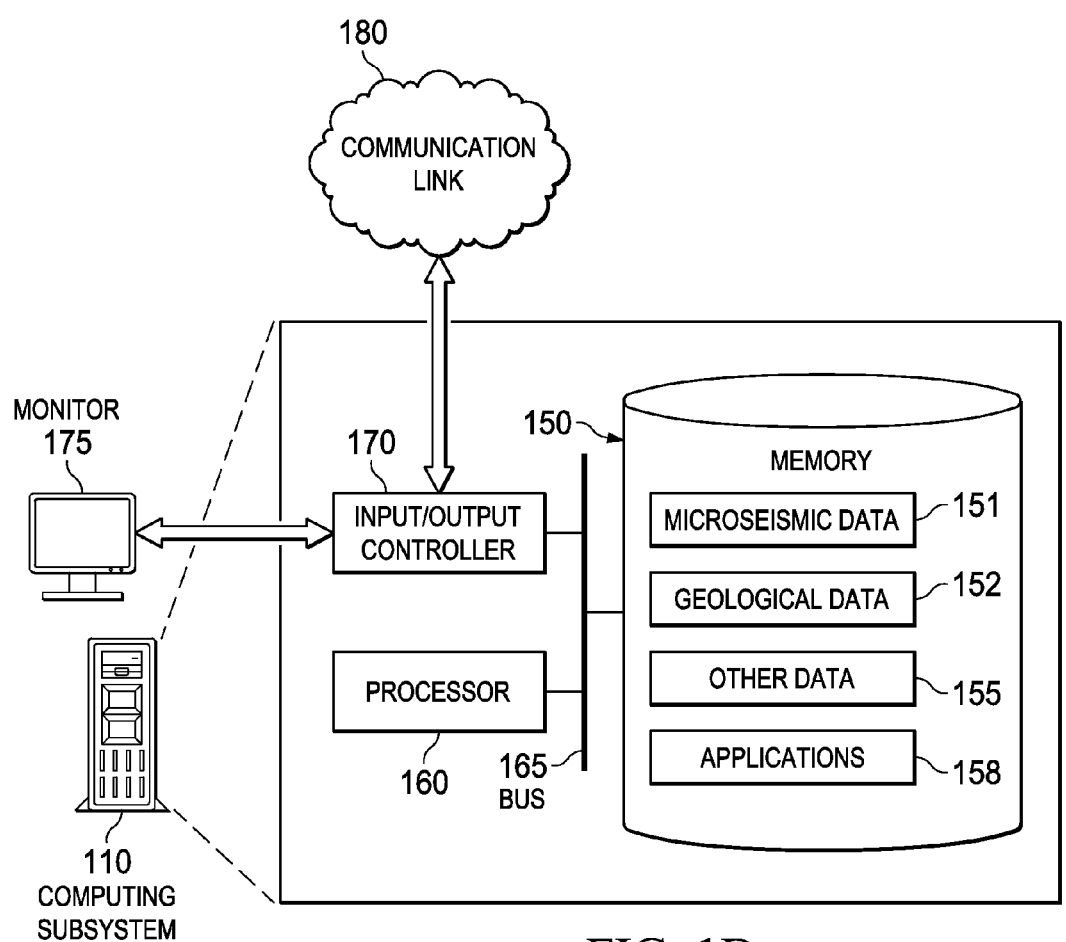
FIG. 1B is a diagram of the example computing subsystem 110 of FIG. 1A.

FIG. 1B is a diagram of the example computing subsystem 110 of FIG. 1A. The example computing subsystem 110 can be located at or near one or more wells of the well system 100 or at a remote location. All or part of the computing subsystem 110 may operate independent of the well system 100 or independent of any of the other components shown in FIG. 1A. The example computing subsystem 110 includes a memory 150, a processor 160, and input/output controllers 170 communicably coupled by a bus 165. The memory 150 can include, for example, a random access memory (RAM), a storage device (e.g., a writable read-only memory (ROM) or others), a hard disk, or another type of storage medium. The computing subsystem 110 can be preprogrammed or it can be programmed (and reprogrammed) by loading a program from another source (e.g., from a CD-ROM, from another computer device through a data network, or in another manner). In some examples, the input/output controller 170 is coupled to input/output devices (e.g., a monitor 175, a mouse, a keyboard, or other input/output devices) and to a communication link 180. The input/output devices receive and transmit data in analog or digital form over communication links such as a serial link, a wireless link (e.g., infrared, radio frequency, or others), a parallel link, or another type of link.

The communication link 180 can include any type of communication channel, connector, data communication network, or other link. For example, the communication link 180 can include a wireless or a wired network, a Local Area Network (LAN), a Wide Area Network (WAN), a private network, a public network (such as the Internet), a WiFi network, a network that includes a satellite link, or another type of data communication network.

The memory 150 can store instructions (e.g., computer code) associated with an operating system, computer applications, and other resources. The memory 150 can also store application data and data objects that can be interpreted by one or more applications or virtual machines running on the computing subsystem 110. As shown in FIG. 1B, the example memory 150 includes microseismic data 151, geological data 152, other data 155, and applications 158. In some implementations, a memory of a computing device includes additional or different data, applications, models, or other information.

The microseismic data 151 can include information on microseismic events in a subterranean area. For example, the microseismic data 151 can include information based on acoustic data detected at the wellbore 102, at the surface 106, or at other locations. The microseismic data 151 can include information collected by sensors 136. In some cases, the microseismic data 151 includes information that has been combined with other data, reformatted, or otherwise processed. The microseismic event data may include any suitable information relating to microseismic events (e.g., locations, times, magnitudes, moments, uncertainties, etc.). The microseismic event data can include data collected from one or more stimulation treatments, which may include data collected before, during, or after a fluid injection.

The geological data 152 can include information on the geological properties of the subterranean zone 104. For example, the geological data 152 may include information on the wellbore 102, or information on other attributes of the subterranean region 104. In some cases, the geological data 152 includes information on the lithology, fluid content, stress profile, pressure profile, spatial extent, or other attributes of one or more rock formations in the subterranean area. The geological data 152 can include information collected from well logs, rock samples, outcroppings, microseismic imaging, or other data sources.

The applications 158 can include software applications, scripts, programs, functions, executables, or other modules that are interpreted or executed by the processor 160. The applications 158 may include machine-readable instructions for performing one or more of the operations related to FIGS. 2-13. The applications 158 may include machine-readable instructions for generating a user interface or a plot, for example, illustrating fracture geometry (e.g., length, width, spacing, orientation, etc.), geometric representations of SRV, SRV overlap, SRV uncertainty, etc. The applications 158 can obtain input data, such as treatment data, geological data, microseismic data, or other types of input data, from the memory 150, from another local source, or from one or more remote sources (e.g., via the communication link 180). The applications 158 can generate output data and store the output data in the memory 150, in another local medium, or in one or more remote devices (e.g., by sending the output data via the communication link 180).

The processor 160 can execute instructions, for example, to generate output data based on data inputs. For example, the processor 160 can run the applications 158 by executing or interpreting the software, scripts, programs, functions, executables, or other modules contained in the applications 158. The processor 160 may perform one or more of the operations related to FIGS. 2-13. The input data received by the processor 160 or the output data generated by the processor 160 can include any of the microseismic data 151, the geological data 152, or the other data 155.

An example process for analyzing the SRV based on microseismic event data is represented in the plots and corresponding description of FIGS. 2A-5B. In some implementations, SRV can be represented geometrically in one dimension, two dimensions, three dimensions, or another representation. The geometrical representation can be of any appropriate shape, for example, including a rectangle, a circle, a polygon, a sphere, an ellipsoid, a polyhedron, a combination of them, etc. The geometrical representation can have any suitable property (e.g., regular, irregular, closed, open, convex, concave, non-convex, non-concave, etc.). As an example, the geometrical representation can include a boundary (e.g., a surface, a 3D convex hull, a 2D polyhedron, etc.) enclosing multiple microseismic event locations.

In some instances, computing a boundary based on microseismic event data can include filtering the collected microseismic event data to identify a selected subset of microseismic events. In some implementations, the microseismic events can be filtered based on the time, location, magnitude, moment, or another attributes of the microseismic events. In some instances, the microseismic events can be filtered according to their associated treatment stage. In some instances, the microseismic events can be filtered to exclude outliers, low density events, or a combination of these and other events. The selected subset of microseismic events can be used to calculate the boundary to represent the SRV for a stimulation treatment.

Figure 2A:
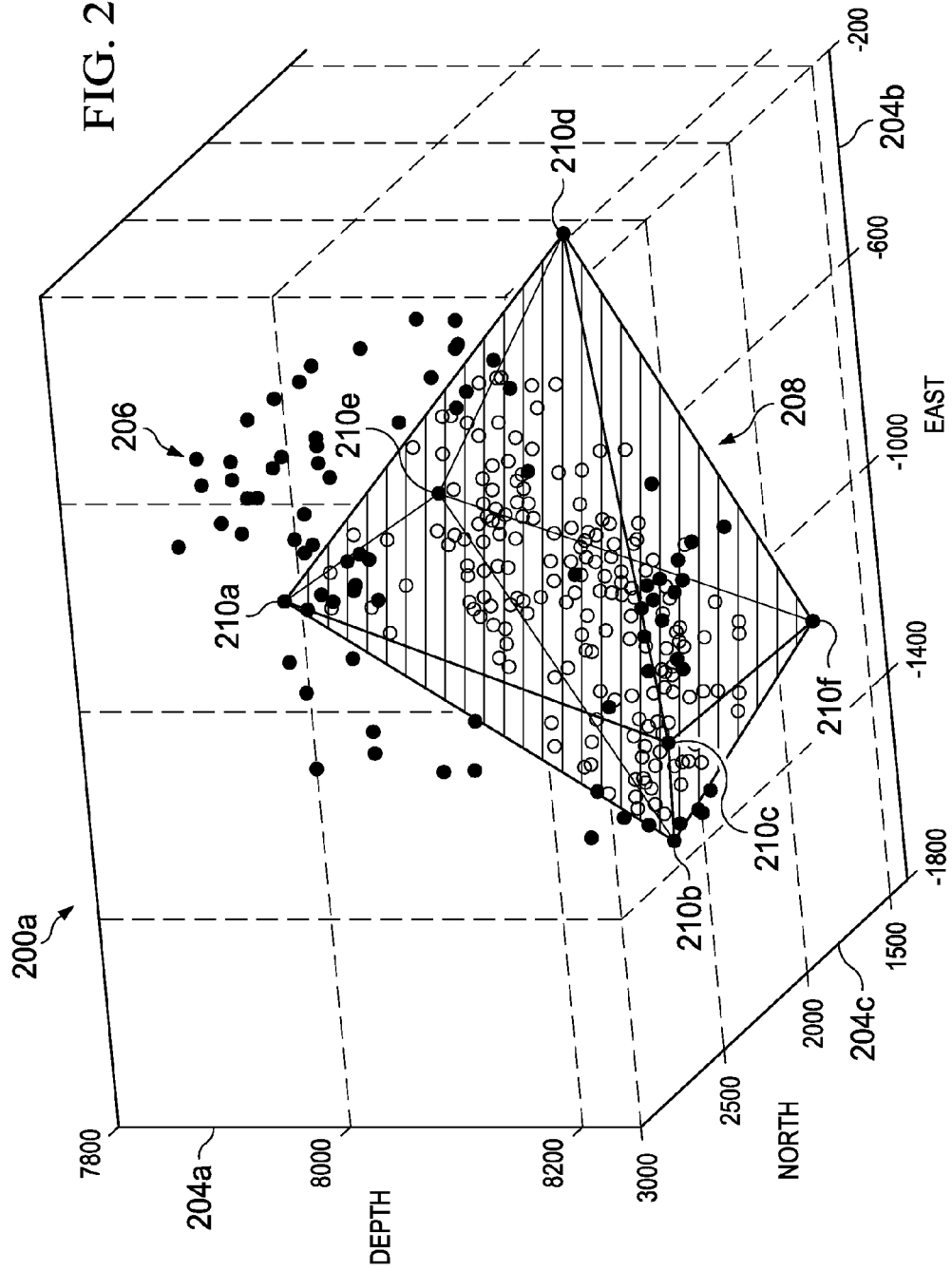
FIG. 2A is a plot showing an example of a boundary calculated from microseismic data.

In some implementations, computing the boundary can include calculating an initial boundary based on multiple microseismic events (e.g., events at extreme locations) as shown in FIGS. 2A, 2B. The calculated boundary can be iteratively expanded based on the selected subset of microseismic events that reside outside the boundary, for example, as shown in FIGS. 3A, 3B and 4A, 4B. As an example, a facet expansion operation may be performed that includes identifying facet expansion groups from the selected subset of microseismic events residing outside the boundary, and expanding facets of the calculated boundary to enclose microseismic events in the expansion groups. In some implementations, the boundary expansion operation can be performed iteratively and result in a boundary that encloses (i.e., contains or intersects) all the events in the selected subset while some other events (e.g., the filtered outliers, low density events, etc.) may reside outside the boundary. In some implementations, the boundary can be refined, for example, based on further filtering, smoothing vertices, edges, etc., as shown in FIG. 5A. The boundary can be used to identify an SRV for a stimulation treatment. For instance, the internal volume of the boundary can be calculated as the SRV for the stimulation treatment.

FIG. 2A is a plot 200a showing an example of a boundary 208 calculated from locations of microseismic events 206. FIG. 2B is another plot 200b showing the example boundary 208 from FIG. 2A. In the illustrated plots 200a-b, the example boundary 208 is an example of a 3D convex hull. The boundary can be another type of geometrical object.

In some instances, the microseismic events 206 can be associated with a single stage of a multi-stage injection treatment. For example, when there are n microseismic events detected during a stage of a hydraulic fracture treatment, each microseismic event can be represented as a location $(x_i, y_i, z_i)$, $1 \le i \le n$, corresponding uncertainty and possibly other parameters. The microseismic events 206 may be located in the production pay zone, contributing to the SRV, or other locations.

The example plot 200a shows the SRV in a three-dimensional rectilinear coordinate system. The coordinate system is represented by the vertical axis 204a and two horizontal axes 204b and 204c. In the example plot 200a, the vertical axis 204a represents a range of depths in a subterranean zone; the horizontal axis 204b represents a range of East-West coordinates; and the horizontal axis 204c represents a range of North-South coordinates (all in units of feet). In some implementations, the data represented in FIG. 2A can be represented by another type of geometrical object in any suitable coordinate system (e.g., spherical coordinates, rectangular coordinates, etc.) or domain. Although the plots show distance information in units of feet, other units can be used. Calculations can be performed and information can be displayed in metric units (mks, cgs, or another system), standard units, or another unit system. In some cases, an algorithm can use metric units, standard units, or convert among unit systems.

In some implementations, before computing an SRV boundary, outliers among the microseismic data can be identified and removed. The outliers can include, for example, statistical outliers, deterministic outliers, or another type of outlier. In some implementations, outliers can contaminate the SRV estimation, for example, when the outliers include reflections of events unrelated to the stimulation treatment. Excluding the outliers can reduce or eliminate interference from other unrelated events to the SRV identification and can lead to a more accurate estimation of the SRV for the stimulation treatment. In some instances, outliers deviate markedly from other events, and can be isolated points based on a threshold, a statistical deviation, or another criterion. For example, deterministic outliers may have an outrageous location, moment, or any other attribute and may belong to another wellbore or another irrelevant treatment. The deterministic outliers can be identified and cleared, for example, by removing microseismic events with a certain attribute exceeding a threshold. In some implementations, outliers can be detected based on statistical properties of the microseismic data set. For example, in some cases, statistical outliers include microseismic events whose distance from an average location of the microseismic events is larger than a threshold. The average location can be, for example, the mean value of the locations ($x_i, y_i, z_i$), $1 \leq i \leq k$, of the microseismic events in the data set. The threshold can be, for example, the sum of the computed mean value and three (or two, four, etc.) times the standard deviation. In such cases, an example technique to identify the outliers can include calculating the mean and standard deviation for the set of the microseismic events. Additional or different criteria or techniques can be used to detect outliers. FIG. 5A shows five example outliers 555 lying outside an example boundary 508.

In some examples, after removing outliers from the microseismic data, an initial boundary can be calculated based on the remaining microseismic events. In some implementations, the initial boundary can be calculated based on identifying events at extreme locations. The events at extreme locations can include events with the minimum and maximum coordinates (e.g., the minimum x-coordinate and the maximum x-coordinate, the minimum y-coordinate and the maximum y-coordinate, and the minimum z-coordinate and the maximum z-coordinate). In the example plot 200a, the axes 204a, 204b, and 204c can be the z-coordinate, x-coordinate, and the y-coordinate, respectively. Six events 210a-210f at extreme locations can be identified and regarded as vertices of an initial boundary. The example boundary 208 is constructed based on the six vertices 210a-210f. The initial boundary 208 has eight triangular facets 220a-220h, as shown in FIG. 2B, and the initial boundary 208 can be expanded to enclose additional microseismic events. In some cases, the facets can be expanded independent of the events (shown as open circles) lying inside the initial boundary 208. The events (shown as solid circles) lying outside the initial boundary 208 can be assigned to eight facet expansion groups. In the example shown, each expansion group is associated with one of the eight facets 220a-220h. FIG. 2B shows four top triangular facets 220a-220d of the initial boundary 208 each with a respective arrow. The initial boundary 208 can be expanded to enclose events in the facet expansion groups, for example, according to a facet expansion operation.

An example facet expansion operation is described as follows. In some implementations, the average location of the six vertices 210a-210f can be calculated and denoted $P_0$ ($x_0, y_0, z_0$). $P_0$ lies inside the initial boundary 208. A triangular facet containing three non-collinear vertices ($x_1, y_1, z_1$), ($x_2, y_2, z_2$) and ($x_3, y_3, z_3$) can be described by equations (1-a)-(1-e):

$$ax + by + c + d = 0 \qquad (1\text{-a})$$
where $$a = \begin{vmatrix} 1 & y_1 & z_1 \\ 1 & y_2 & z_2 \\ 1 & y_3 & z_3 \end{vmatrix}, \qquad (1\text{-b})$$

$$b = \begin{vmatrix} x_1 & 1 & z_1 \\ x_2 & 1 & z_2 \\ x_3 & 2 & z_3 \end{vmatrix}, \qquad (1\text{-c})$$

$$c = \begin{vmatrix} x_1 & y_1 & 1 \\ x_2 & y_2 & 1 \\ x_3 & y_3 & 1 \end{vmatrix}, \qquad (1\text{-d})$$

$$d = -\begin{vmatrix} x_1 & y_1 & z_1 \\ x_2 & y_2 & z_2 \\ x_3 & y_3 & z_3 \end{vmatrix}. \qquad (1\text{-e})$$

A facet may be described in another manner. The normal distance from the average location $P_0$ ($x_0, y_0, z_0$) to the facet can be given by $$d_0 = -\frac{ax_0 + by_0 + cz_0 + d}{\sqrt{a^2 + b^2 + c^2}}$$

and the normal distance from an event $P_i$ ($x_i, y_i, z_i$) to the facet can be given by $$d_i = -\frac{ax_i + by_i + cz_i + d}{\sqrt{a^2 + b^2 + c^2}}.$$

These distances can have a sign ($\pm$) if these events do not exactly lie on the facet. For example, if $d_0 * d_i$ is positive, then $P_0$ and $P_i$ lie on the same side of the facet; if $d_0 * d_i$ is negative, then $P_0$ and $P_i$ lie on the opposite sides of the facet. In some implementations, the events satisfying the condition $d_0 * d_i < 0$ can be identified as a facet expansion group associated with the facet. In some cases, the events in the facet expansion group associated with a facet lie on the same side of the facet. In the illustrated example of FIG. 2B, eight expansion groups can be associated with the eight facets 220a-220h, respectively. In some implementations, the assignment of an event to an expansion group is not a one-to-one mapping. For example, one event may be assigned to more than one group, and two or more groups may intersect each other and share one or more common events.

In some instances, two or more of the six events 210a-210f at extreme locations may collapse with each other. As such, the initial convex set may have less than eight (e.g., six or four) facets. A similar facet expansion process can apply to these cases without affecting the final result.

Figure 4A:
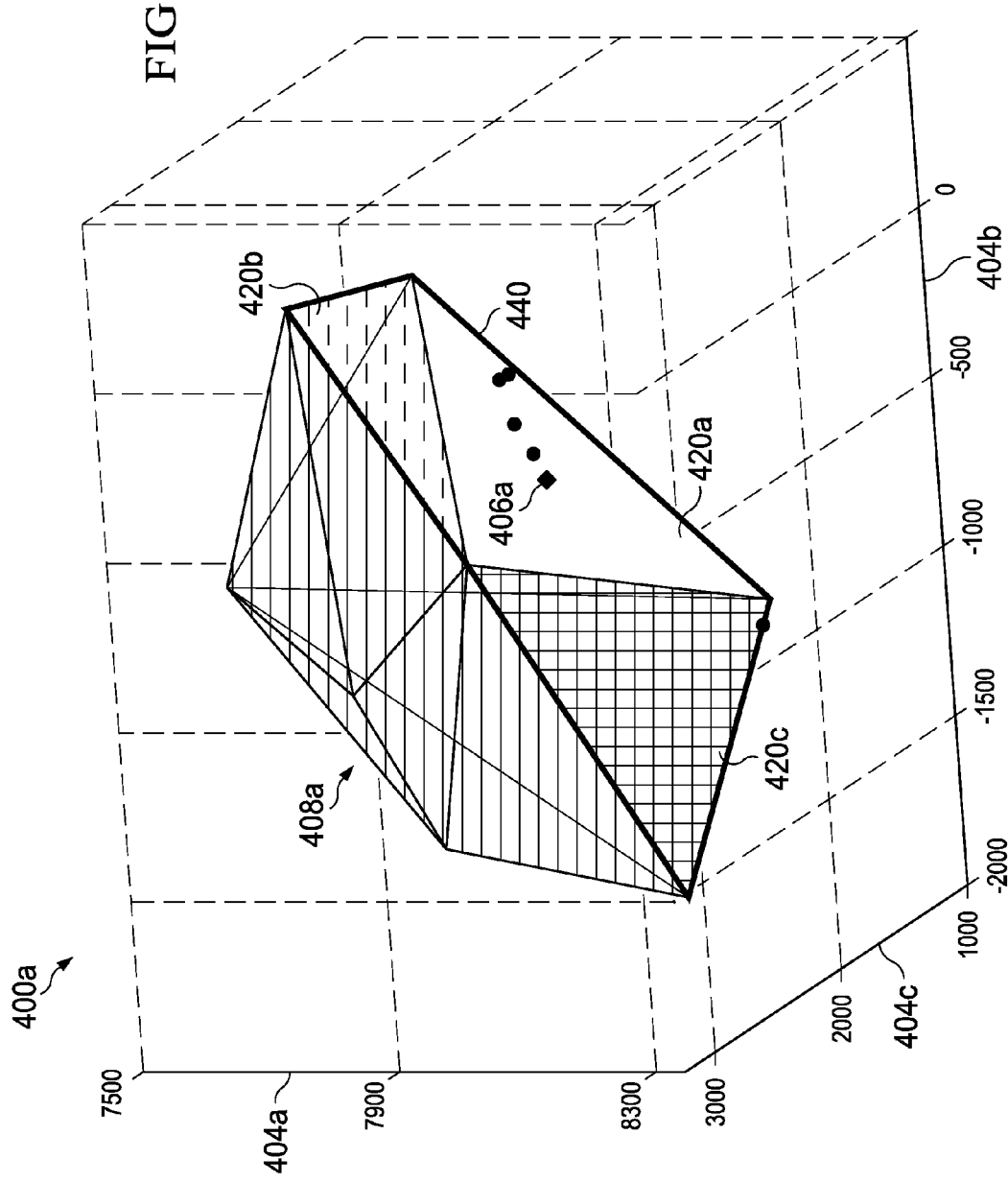
FIG. 4A is a plot showing an example of a boundary and microseismic data.

For each expansion group associated with a facet, the facet expansion operation can modify the facet to enclose the microseismic events in the expansion group. The operation can include identifying an event that has the maximum distance from its associated facet. The event with the maximum distance from the facet can be a vertex of an updated version of the boundary. In some instances, such an event may be shared by other expansion groups, and the operations can be modified accordingly. FIGS. 3A and 3B are plots showing example boundaries and microseismic events when the event with the maximum absolute distance from its associated facet only belongs to one expansion group. FIGS. 4A and 4B are plots showing example boundaries and microseismic events when the event with the maximum distance from its associated facet is shared by multiple expansion groups.

FIG. 3A is a plot 300a showing an example of a boundary 308a and microseismic data. As illustrated, the example boundary 308a is a 3D convex set, and an example expansion group associated with a facet 320a includes three microseismic events 306a-c. Among three events, the microseismic event 306a has the maximum distance from the associated facet 320a. In the situation, the event 306a belongs only to the subset associated with the facet 320a. The boundary 308a can be updated to enclose the expansion group associated with the facet 320a.

FIG. 3B is a plot 300b showing an example updated boundary 308b, which is an updated version of the boundary 308a shown in FIG. 3A. The updated boundary can be generated based on the expansion group associated with the facet 320a in FIG. 3A. In an example process, the event 306a can be selected as a new vertex of the updated boundary 308b. The original facet 320a of the boundary 308a can be deleted and three new triangular facets 320b-d can be created. Each of the new triangular facets 320b-d has the event 306a and another two vertices of the three vertices 306e-g of the facet 302a as its vertices. The selection of the event 306a with the maximum absolute distance can guarantee that the new facets 320b-d along with the other seven facets of the boundary 308a make up a convex set.

In the example plot 300b, the three new triangular facets 320b-d and the original triangular facet 320a make up a tetrahedron 330. Those events inside the tetrahedron 330 can be removed from the expansion group. Applying a facet expansion operation on the events outside the tetrahedron 330 can create three new expansion groups associated with each of the three new facets 320b-d. In some instances, since the orientations of new triangular facets 320b-d can be different from the original facet 320a, events associated with neighbors of the facet 320a may also be expanded to the three new expansion groups.

FIG. 4A is a plot 400a showing an example of a boundary 408a and microseismic data; FIG. 4B is a plot 400b showing an updated version of the example boundary 408a from FIG. 4A. In the example plot 400a of FIG. 4A, the example boundary 408a is a 3D convex set, and an example expansion group associated with a facet 420a includes multiple microseismic events. Among the multiple microseismic events, the event 406a has the maximum distance from its associated facet 420a. In the situation shown in FIG. 4A, the event 406a is shared by two other expansion groups associated with facets 420b and 420c respectively, in addition to the group associated with facet 420a. In some instances, to identify a facet with which an event (e.g., event 406a) is associated, one can image that the event 406a is a small light bulb. The facets (e.g., facets 420a-c) that can be illuminated by the event 406a (or the facets that are visible to the location at the event 406a) can be facets associated with the event 406a. Additional or different techniques can be used to identify facets that are associated with the event 406a. The boundary 408a can be updated to enclose the expansion groups that include the event 406a.

FIG. 4B is a plot 400b showing an example updated 3D boundary 408b based on the 3D boundary 408a and the subsets that include the event 406a in FIG. 4A. In an example process, the internal edges shared by any two adjacent facets of the facets 420a-c can be erased. The external edges form a boundary 440 of the facets 420a-c. The three facets 420a-c of the boundary 408a can be deleted and new triangular facets 420d-h can be created. Each of the five new facets 420d-h has the event 406a and any two adjacent vertices on the boundary 440 as its vertices. In some instances, selecting the event 406a with the maximum distance can guarantee that the new facets 420d-h along with the rest of the facets of the boundary 408a make up a convex set.

In the example plot 400b, the old facets 420a-c and new facets 420d-h form a new polyhedron 430. The events inside the polyhedron 430 can be removed from the expansion groups. The facet expansion operation performed based on the events outside the polyhedron 430 can create five new expansion groups associated with the five new facets 420d-h, respectively. In some implementations, the events in these new groups may come not only from the events associated with the facets 420a-c but also from the events associated with the other facets that neighbor the facets 420a-c.

In the example operations described with respect to FIGS. 2A-4B, the geometric object plotted is a convex set. In some implementations, the created structure is not convex, and it can be another shape. The operations can be repeated based on expansion groups until there are no events in any of the groups. Then a final boundary can be obtained and its facets form the boundary of the final boundary. During the recurrent operations, events inside the created structure can be excluded, thus the computational complexity can be the order n log(n) where n is the number of input microseismic events and the algorithm can be implemented with a fast computational performance.

In some implementations, a calculated boundary can be refined, for example, by filtering out low event density points. For a given event, an event density can be calculated, for example, based on the number of events per unit volume about the event, based on the average distance to nearest neighbor events, or based on other information. In some instances, a boundary may have lower event density at its vertices than other places inside the boundary. To obtain more accurate SRV, the events at vertices whose event density is less than a threshold (a parameter) can be removed. The same operation as described above can be used to construct a new boundary based on the updated event data to improve the SRV estimation. In some implementations, the refinement of the calculated boundary can be applied to the initial boundary, the final boundary, an intermediate boundary, or at any appropriate time.

FIG. 5A is a plot 500a showing an example of a boundary 508 and microseismic data. The example boundary 508 is a 3D convex hull. In some instances, the boundary 508 can be constructed based on an updated event data set of 581 microseismic events. In this example, the updated event data set does not include two low density events 565 and five outliers 555. The example boundary 508a has 43 vertices and 82 triangular facets. FIG. 5A also shows a wellbore 550 and perforation clusters 560.

The volume of the boundary 508 can be calculated to get the SRV. As an example technique, the center of the boundary 508 can be computed. The center can be, for example, the average location of the vertices. Associated with each facet of the boundary 508, a tetrahedron can be constructed. One vertex of the tetrahedron can be the center and the other three vertices can be three vertices of the facet. The volume of a tetrahedron is one-third of the product of the area of the facet and the distance from the center to the facet. The SRV can be the sum of the tetrahedrons' volumes. For example, the SRV in FIG. 5A is 2.77 $(10)^8$ cubic feet ($ft^3$). Additional or different techniques can be used to compute SRV based on the constructed boundary.

In some implementations, a boundary constructed based on locations of microseismic data can be associated with an uncertainty. For example, some or all of the microseismic events may have the low-amplitude or low-energy (e.g., with Richter magnitude of less than three), and the measurement location uncertainty can affect the computation of the surface associated with the events' location. While acquiring microseismic events, sensor distribution, data quality, observational distance, underlying velocity model, an applied localization algorithm, or a combination of these and other factors can affect the accuracy of a measured location of a microseismic event. In some instances, the event location can have azimuth uncertainty relative to an observation well, distance uncertainty relative to the observation well, or depth uncertainty.

In some instances, three or more uncertainty quantities (event's azimuth uncertainty, distance uncertainty, and depth uncertainty) can be applied directly to the constructed boundary. To translate these location uncertainties to the boundary's uncertainty, an example technique is to approximate an individual event's 3D uncertainty space by a ball with radius r, given by equation (2):

$$\frac{4}{3}\pi r^3 = \quad (2)$$

(azimuth uncertainty) * ... (distance uncertainty) * (depth uncertainty).

The approximation can preserve the volume of uncertainty space. In some context, the uncertainty quantity, r, of an individual event is much smaller than the length of any of the facets' edges. Additional or different techniques can be used to describe and quantify the uncertainty of the microseismic event.

One example technique to measure the SRV uncertainty can include constructing an inner and an outer alternative boundaries based on the events' uncertainty quantity r. For example, the center of a convex hull can be denoted as $P_0$ ($x_0$, $y_0$, $z_0$). For each vertex P ($x_p$, $y_p$, $z_p$) of the convex hull, an interior projection (or "shrink") point on the segment $P_0P$ and an exterior projection (or "extent") point on the extension of the line $P_0P$ can be found. If the length of the segment $P_0P$ is L, the coordinate components of the interior point can be given by:

$$x = x_0 + \frac{L-r}{L}(x_p - x_0) \quad (3\text{-a})$$

$$y = y_0 + \frac{L-r}{L}(y_p - y_0) \quad (3\text{-b})$$

$$z = z_0 + \frac{L-r}{L}(z_p - z_0), \quad (3\text{-c})$$

and the components of the exterior point can be given by:

$$x = x_0 + \frac{L+r}{L}(x_p - x_0) \quad (4\text{-a})$$

$$y = y_0 + \frac{L+r}{L}(y_p - y_0) \quad (4\text{-b})$$

$$z = z_0 + \frac{L+r}{L}(z_p - z_0), \quad (4\text{-c})$$

where r is the uncertainty radius of the given event at the vertex. Some or all of the exterior points can be used to construct an outer uncertainty boundary; some or all of the interior points can be used to construct an inner uncertainty boundary. The volume difference between these two uncertainty boundaries can be used as a measure of the SRV uncertainty. In some implementations, additional or different inner or outer bounds can be identified based on the microseismic events and the SRV uncertainty can be determined in another manner based on other information.

Figure 5B:
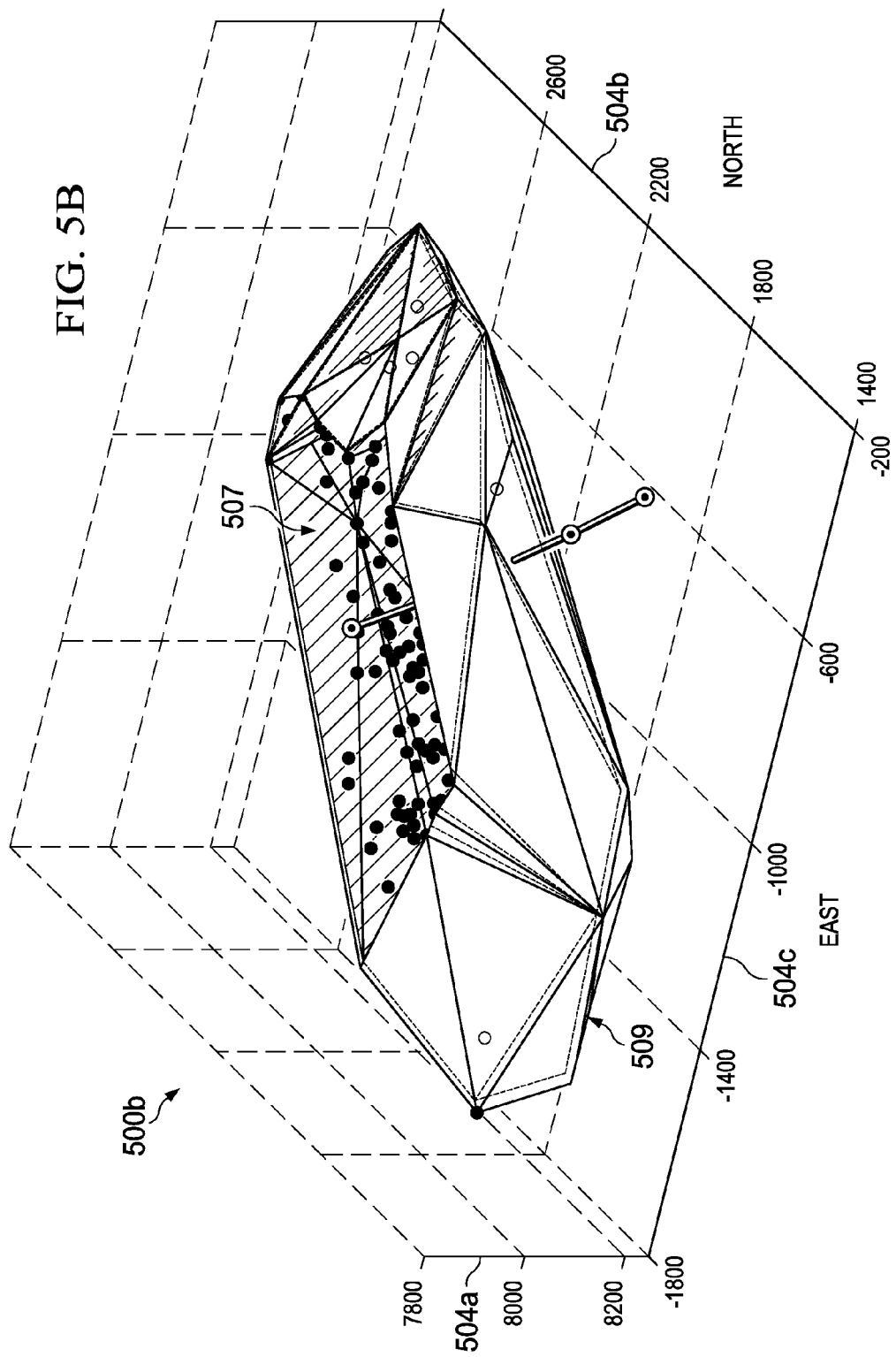
FIG. 5B is a plot showing inner and outer uncertainty boundaries associated with the example boundary 508 in FIG. 5A.

FIG. 5B is a plot showing an inner uncertainty boundary 507 and an outer uncertainty boundary 509 associated with the example boundary 508 in FIG. 5A. The example inner and outer boundaries are illustrated as an inner boundary 507 and an outer boundary 509, respectively. The boundaries 507, 508, and 509 are defined in a common spatial domain with axes 504a-c. To better visualize the microseismic events inside the boundary 508, the top 12 facets are open (removed) in the figure. In the illustrated plot 500b, the SRV uncertainty is 1.873 (10)$^7$ cubic (ft$^3$), about 6.7% of the calculated SRV.

In some instances, a multi-stage injection treatment can be applied to a subterranean region. The multi-stage injection treatment may include individually treated stages and microseismic event data can be obtained for each stage. In some implementations, the example process described above for analyzing the SRV can be applied to the microseismic event data associated with each individual stage. For example, the microseismic event data associated with each individual stage can be filtered (e.g., to exclude outliers, low density events, etc.) and analyzed (e.g., for computing a boundary to enclose a subset of the microseismic events associated with each stage, identifying an SRV for each stage based on the computed boundary, etc.). In some instances, physical connection or fluid communication may exist between stimulated regions of multiple stages. The SRVs for two or more stages may overlap with each other. The overlapping volume of SRVs and the overlap of boundaries can be identified based on the microseismic event data. In some implementations, a total SRV for the multi-stage injection treatment can be identified based on the SRV for each stage and the overlapping volume between stages.

FIG. 6 is a plot 600 showing example microseismic event data collected from a multi-stage hydraulic fracturing treatment. In some implementations, a multi-stage hydraulic fracturing strategy can be used in long horizontal wells to improve stimulated reservoir volume. Microseismic event data can be collected at each stage of the multi-stage fracturing treatment. The example plot 600 shows a subset 610 that includes 770 microseismic events (shown as circles) at stage 1, a subset 620 that includes 1201 events (shown as squares) at stage 2, a subset 630 that includes 476 events (shown as triangles) at stage 3, and a subset 640 that includes 424 events (shown as diamonds) at stage 4. A wellbore 650 and perforation clusters 660 for the example four-stage hydraulic fracturing treatment are also shown in FIG. 6.

FIG. 7 is a plot 700 showing a three-dimensional (3D) representation of overlapping SRVs associated with distinct stages of a multi-stage injection treatment. In the illustrated plot 700, the boundaries 710, 720, 730, and 740 are constructed based on the events subsets 610, 620, 630, and 640 in FIG. 6, respectively. The boundaries can be constructed according to the example technique described with respect to FIGS. 2A-5B, or based on another technique. In the example shown in FIG. 7, the SRVs associated with the four stages are 7.83 (10)$^8$, 9.56 (10)$^8$, 7.74 (10)$^8$ and 8.73 (10)$^8$ cubic feet (ft$^3$) respectively.

In some instances, the total SRV for a multi-stage hydraulic fracturing treatment is not directly obtained from the individual SRV quantities of each stage. For example, there may be overlapping volumes between the stages. FIG. 7 shows boundaries 715, 725, and 735 of SRV overlap regions between stage 1 and stage 2, stage 2 and stage 3, and stage 3 and stage 4, respectively. In some cases, in addition to neighboring stages, geographically close stages can also overlap or otherwise affect each other. For example, stage 1 and stage 4 may overlap with or otherwise influence each other. In some implementations, the overlapped volumes indicate possible fluid communication between the stages during the hydraulic fracturing process. Such communications may include the diversion of treatment fluid and may decrease the efficiency of an individual hydraulic fracturing treatment.

An example process for approximating or otherwise identifying overlapping volumes between treatment stages is described as follows. In some implementations, a first phase of the process can include identifying microseismic events shared by two stages. Such events lie inside boundaries of both stages and thus are inside the overlapping volume. For example, to determine the SRV overlap 715 between stage 1 and stage 2 in FIG. 7, the events at stage 1 that also lie inside the boundary 720 of stage 2 can be identified. In some implementations, all events enclosed by the boundary 710 of stage 1 can be scanned. For each event at stage 1, the facets of the boundary 720 of stage 2 can be scanned. For each facet of the boundary 720, whether the event and the center of the boundary 720 lie on the same side of the facet can be determined. In some instances, such a determination can be made by assessing whether a product of their respective distances to the facet is positive. If positive, the event and the center are on the same side; if negative, the event and the center are on opposite sides. In some cases, if the event and the center lie on the same side of each considered facet for all the facets of the boundary 720, the event can be identified as being shared by the two stages. Similarly, the above process can be applied to identify the events at stage 2 which also lie inside the boundary 710 of stage 1. After this phase, a set of events commonly shared by the two stages can be found.

In some implementations, a second phase of the process can include identifying points intersected by a facet of a boundary created at one stage and an edge of a boundary created at another stage. As an example, intersected points where the facet belongs to the boundary 710 of stage 1 and the edge belongs to the boundary 720 of stage 2 can be identified. Specifically, facets of the boundary 710 can be identified among whose three vertices, one of them belongs to the event set identified in the first phase and one of them does not belong to the event set. The conditions can be sufficient for the facets to intersect with the boundary 720. For each such facet, whether there is an edge of the boundary 720 traversing the facet can be determined. In some instances, it can be determined whether one end of the edge belongs to the event set identified in the first phase and another end does not belong to the identified event set; or it can be determined that the intersected point lies inside the facet. Mathematically, the edge can be given by:

$$x = x_p + t(x_Q - x_p), \quad (5\text{-a})$$

$$y = y_p + t(y_Q - y_p), \quad (5\text{-b})$$

$$z = z_p + t(z_Q - z_p), \quad (5\text{-c})$$

where $0 < t < 1$, and where P $(x_p, y_p, z_p)$ and Q $(x_Q, y_Q, z_Q)$ are two ends of the edge. Substituting the equations (5-a), (5-b), and (5-c) into equation (1) can yield the parameter t, and plugging t into equation (5-a), (5-b), and (5-c) can obtain the intersected point. If for all edges of the facet, the intersected point lies on the same side as the center of the facet, the point can be identified as residing in the overlapping volume. Similarly, the above process can be applied to identify points that are intersected by a facet belonging to the boundary 720 of stage 2 and an edge belonging to the boundary 710 of stage 1.

In some implementations, a third phase of the process can include calculating a geometrical object (e.g., a convex hull or another type of object) based on the microseismic events identified in the first phase and intersected points found in the second phase. The boundary can be calculated according to the example technique described with respect to FIGS. 2A-5B, or can be calculated in another manner. The boundary can represent the overlapping volume between two stages. As shown on the top area of FIG. 7, the boundaries 715, 725, and 735 are the SRV overlaps between two adjacent stages among the four stages. The volumes of these overlapping parts are 8.56 $(10)^7$, 9.09 $(10)^7$ and 4.16 $(10)^8$ cubic feet (ft$^3$), occupying 9.0%, 11.7% and 47.7% of SRVs of stage 2, stage 3 and stage 4, respectively. The overlapping volumes among stage 3 and its two adjacent stages (stage 2 and stage 4) is 5.07 $(10)^8$ ft$^3$, occupying 65.5% of SRV of stage 3.

The total SRV for a multi-stage hydraulic fracturing treatment can be calculated based on the overlapping volume. For example, the total SRV for a two-stage treatment can be calculated by equation (6):

$$\text{Total SRV}(\text{stage1} \cup \text{stage2}) = \text{SRV}(\text{stage1}) + \text{SRV}(\text{stage2}) - \text{SRV}(\text{stage1} \cap \text{stage2}) \quad (6)$$

Generally, the total SRV for a m-stage hydraulic fracturing treatment can be, for example, given by equation (7):

$$\text{Total } SRV\left(\bigcup_{i=1}^{m} \text{stage}(i)\right) = \sum_{i=1}^{m} SRV(\text{stage}(i)) - \sum_{i>j} SRV(\text{stage}(i) \cap \text{stage}(j)) + \sum_{i>j>k} SRV(\text{stage}(i) \cap \text{stage}(j) \cap \text{stage}(k)) - \ldots + (-1)^m SRV\left(\bigcap_{i=1}^{m} \text{stage}(i)\right)$$

In the example illustrated in FIG. 7, the total volume for the multi-stage treatment is 2.79 $(10)^9$ (ft$^3$). In some implementations, the total SRV can be calculated according to a variation of equation (6) or (7), or in another manner.

In some implementations, a stimulated subterranean area and extension of hydraulic fractures can be determined based on microseismic event data. For instance, the stimulated area contacting a production pay zone can be determined by projecting 3D microseismic events onto a reference plane. For example, a reference plane can be given by $ax + by + cz + d = 0$. An example reference plane can be a horizontal plane. Based on the plane equation, the plane orientation angles, strike $\theta$ and dip $\phi$, can be, for example, given by equations (8) and (9):

$$\theta = \arctan\frac{b}{a}, \quad (8)$$

$$\varphi = \arctan\frac{\sqrt{a^2 + b^2}}{c}. \quad (9)$$

For a given treatment stage, after filtering the events (e.g., excluding outliers and events with low density), the remaining events can be projected onto the reference plane, for example, by following linear transformation $$\begin{bmatrix} s \\ t \\ u \end{bmatrix} = \begin{bmatrix} \cos\theta\cos\phi & \sin\theta\cos\phi & -\sin\phi \\ -\sin\theta & \cos\theta & 0 \\ \cos\theta\sin\phi & \sin\theta\sin\phi & \cos\phi \end{bmatrix} \begin{bmatrix} x - X_0 \\ y - Y_0 \\ z - Z_0 \end{bmatrix} \quad (10)$$

where $(X_0, Y_0, Z_0)$ is a point on the reference plane. Note that the selection of the point $(X_0, Y_0, Z_0)$ does not affect results. The above equations (8)-(10) can transform an event's 3D location (x, y, z) to the plane coordinates (s, t, u), where actually the u-component is zero. In some implementations, the u coordinate component can be ignored and only the (s, t) coordinates are taken in the following calculation. In some instances, the x-y coordinates can be used to represent the s-t coordinates, i.e., the locations of these projected events can be expressed as (x, y) in the x-y coordinates.

FIG. 8 is a plot 800 showing a two-dimensional (2D) projection of microseismic events of a multi-stage injection treatment and example two-dimensional geometrical representations of stimulated contact areas. In the illustrated example, four sets of projected microseismic events 810, 820, 830, and 840 can be obtained by projecting the 3D microseismic events in the subsets 610, 620, 630, and 640 of FIG. 6 onto a horizontal reference plane 850, respectively. Based on the four sets of 2D microseismic data, the four boundaries 815, 825, 835, and 845 can be constructed. The example boundaries 815, 825, 835, and 845 are 2D convex polygons. Other types of two-dimensional boundaries can be computed. The sizes of the polygons can represent the stimulated area contacting the subterranean region. A 2D convex polygon can be calculated in a manner that is analogous to the process of constructing a 3D convex hull, or in another manner. In some other implementations, the 2D boundaries may be obtained by projecting the constructed 3D boundaries 710, 720, 730, and 740 onto the reference plane 850. In some implementations, the 2D geometrical representation of the stimulated contact area can be of a different shape and may be calculated using another technique.

In some instances, analysis and estimation of SRV can be performed in real time, for example, during the collection of microseismic events. The example techniques described here can be applied, for example, to a real-time hydraulic fracturing process, for multi-stage completions with multiple perforation clusters in a stage, or in other contexts.

In some cases, stimulated volumes can start and emit from perforation points on the wellbore. As such, at an initial phase of treatment, each perforation cluster may be surrounded by a local region of stimulated rock. As the hydraulic fracturing process evolves, the local regions of stimulated rock can gradually grow. In some instances, several local regions or paths of stimulated rock can merge, and eventually form a larger volume of stimulated rock.

As an example aspect of operation, an algorithm for computing SRV in real time includes obtaining input information related to the perforation clusters at each stage, for example, including the number of perforations, location of each perforation, distance between two adjacent perforations, or other information. At the initial time period of the hydraulic fracturing treatment, as a new microseismic event is detected, the distance from this event to each perforation can be calculated. The event can be associated with the perforation that has the minimum distance to the event and the event can be a supporting event of the perforation.

In some implementations, the algorithm can start to generate an SRV related to a perforation when a minimum number of supporting events of the perforation have been accumulated. For instance, the minimum number of supporting events can be four. With the four supporting events, a tetrahedron can be constructed; the tetrahedron can represent the initial local region of stimulated rock associated with the perforation. In some aspects of implementations, once a local region associated with a perforation is identified, the perforation can be defined as the center of the local region, or the center of the local region may be defined otherwise.

When a new event appears on the buffer, it can be associated with the center or the perforation. In some instances, there may be three cases: a) a distance from the event to the center is larger than the distance from the center to its adjacent center; otherwise, the following two cases can be considered: b) the event lies outside the local region; c) the event lies within the local region. In case c), the new event does not affect the local region. In case b), the new event can make the local region propagate into its surroundings and grow. In some implementations, the new event can become a vertex of an expanded boundary, for example, based on an example process described below. In case a), the local region can be merged with its neighbor, for example, a local region or events associated with its adjacent perforation. In a next level, the algorithm can merge the events associated with two adjacent centers or perforations and then use the set of merged events to construct a larger boundary (e.g., a convex hull, or another type of boundary) to represent the stimulated rock region that contains the merged events. The center of the new boundary can be the average of the set of the two adjacent centers or perforations. In some implementations, as long as new events are being detected, the recurrent process can be applied until the boundaries associated with the perforations are merged into a common boundary. In some implementations, during the accumulation of microseismic events, the algorithm can enable users to visualize the temporal and spatial evolution of the stimulated rock region and their merging processes.

In some implementations, the boundary can enclose all detected microseismic events. The center of the boundary can be the average of its vertices or another location. When a new event is detected, if the event lies inside the local region, it does not affect the local region; otherwise, it can make the local region propagate into its surroundings and grow into a larger region. In some instances, the latter situation can include two cases.

The first case is that the new event is visible to only one facet of the local region. For example, as illustrated in FIG. 3A, the new event, e.g., event 306a (assuming no events 306b and 306c) is visible only to the facet 320a of the boundary 308a. In other words, the new event 306a and the center of the boundary 308a lie on opposite sides with respect to the facet 320a while they lie on the same side with respect to other facets. In this case, the facet 320a can be deleted, and the algorithm can use the new event 306a along with any two vertices on the facet 320a to create three new triangular facets, for example, facets 320b, 320c, and 320d as plotted in FIG. 3B. As the new event 306a is added, the local region of stimulated rock dynamically propagates and grows, for example, from the boundary 308a to the updated boundary 308b.

The second case is that the new event is visible to multiple facets of the boundary. For example, as depicted in FIG. 4A, the new event, e.g., event 406a is visible to three facets 420a, 420b, and 420c. In other words, the event 406a and the center of the boundary 408a lie on opposite sides with respect to the facets 420a, 420b, and 420c while they lie on the same side with respect to other facets. In this case, the boundary 440 of these three facets can be identified and the three facets 420a, 420b, and 420c can be deleted. The new event 406a and any two adjacent vertices on the identified boundary 440 can be used to create new facets, for example, facets 420d-420h as shown in FIG. 4B. As the new event 406a is enclosed, the local region of stimulated rock dynamically propagates and grows, for example, from the boundary 408a to the updated boundary 408b.

In some instances, one challenge of real-time SRV analysis can be identifying outliers as well as events with low density. Such events may not be readily identifiable during the stimulation treatment. In some implementations, outliers and events with low density can be identified and removed after the treatment, for example, following the same technique discussed with respect to FIG. 5A. Then the algorithm can use the remaining microseismic events to refine the constructed boundary and obtain more accurate SRV. In some implementations, outliers and events with low density may be identified and removed in real time during the treatment. As an example technique, a probability may be tagged with a new microseismic event. Outliers and events with low event density can be identified, for example, by comparing a threshold with the probability associated with the new event. Additional or different techniques can be used to identify the outliers and low density events in real time. The identified outlier and event with low density can be removed in real time and the SRV can be dynamically estimated and analyzed based on remaining events.

In some implementations, experience shows that the accuracy of the SRV estimation becomes more accurate as more microseismic events accumulate. In some instances, removing outliers and events with low density can help refine the geometrical object constructed based on the microseismic events and improve the accuracy of SRV estimation. For instance, especially at early times of real-time SRV estimation, removing outliers and low density events can reduce or eliminate interference introduced by the outliers and low density events which are reflections of activities other than the considered injection treatment. In some instances, the real-time SRV calculation algorithm can monotonically increase the SRV estimation accuracy as the microseismic events accumulate and can help maximize the SRV estimation accuracy.

In some instances, in addition to the volume, other geometric properties of a stimulated subterranean region can be estimated or otherwise identified based on microseismic events as well. The geometric properties can include, for example, a length, width, height, orientation, or another attribute of the SRV for the stimulated region. In some instances, these geometric properties can provide a more adequate and concrete description of the SRV and an overall fracture network within the stimulated reservoir. In some instances, more information of the stimulation region can be extracted based on the geometric properties. Field engineers, operational engineers and analysts, and others can better visualize, learn, or otherwise analyze the subterranean region, and can manage the stimulation treatment accordingly.

In some implementations, the geometric properties of the SRV for the stimulated region can be identified based on a computed SRV boundary. For instance, a major axis of the SRV can be identified based on the SRV boundary. The major axis can include information regarding, for example, lateral extension and orientation as well as the development of the stimulated region. For example, the major axis may reflect the extension and orientation of the primary fractures of the fracture network inside the stimulated region. Additional or different geometric properties and information can be identified based on the SRV boundary.

The SRV boundary can include, for example, a sphere, a cube, an ellipsoid, a cylinder, a polyhedron, or another geometrical object. As a specific example, the SRV boundary can include an ellipsoid. The geometric properties of the ellipsoid can be used to quantify and characterize the geometric properties of the stimulated region and the fracture network inside the stimulated region. For instance, an ellipsoid in a Cartesian coordinate system can be characterized by nine parameters that include, a center, semi-lengths of x-axis, y-axis and z-axis, and rotation angles along these axes. In some implementations, the lengths of semi-axes can be used to approximate or otherwise represent the length, width and height of the SRV for the stimulated region and the rotation angles can be used to characterize the orientation of the SRV for the stimulated region. In some implementations, additional or different parameters can be selected to describe the geometric properties of the stimulated region.

Various algorithms and methods can be used to construct an ellipsoid based on the microseismic event locations associated with a stimulation treatment. One example approach can involve fitting an ellipsoid to a set of microseismic event locations. As a specific example, the set of locations can include the vertices of a computed SRV boundary (e.g., a convex hull). The ellipsoid can be computed according to a least square method such that the distances between the ellipsoid and the vertices of the convex hull are minimized. The ellipsoid can be computed based on additional or different principles or techniques.

Figure 15B:
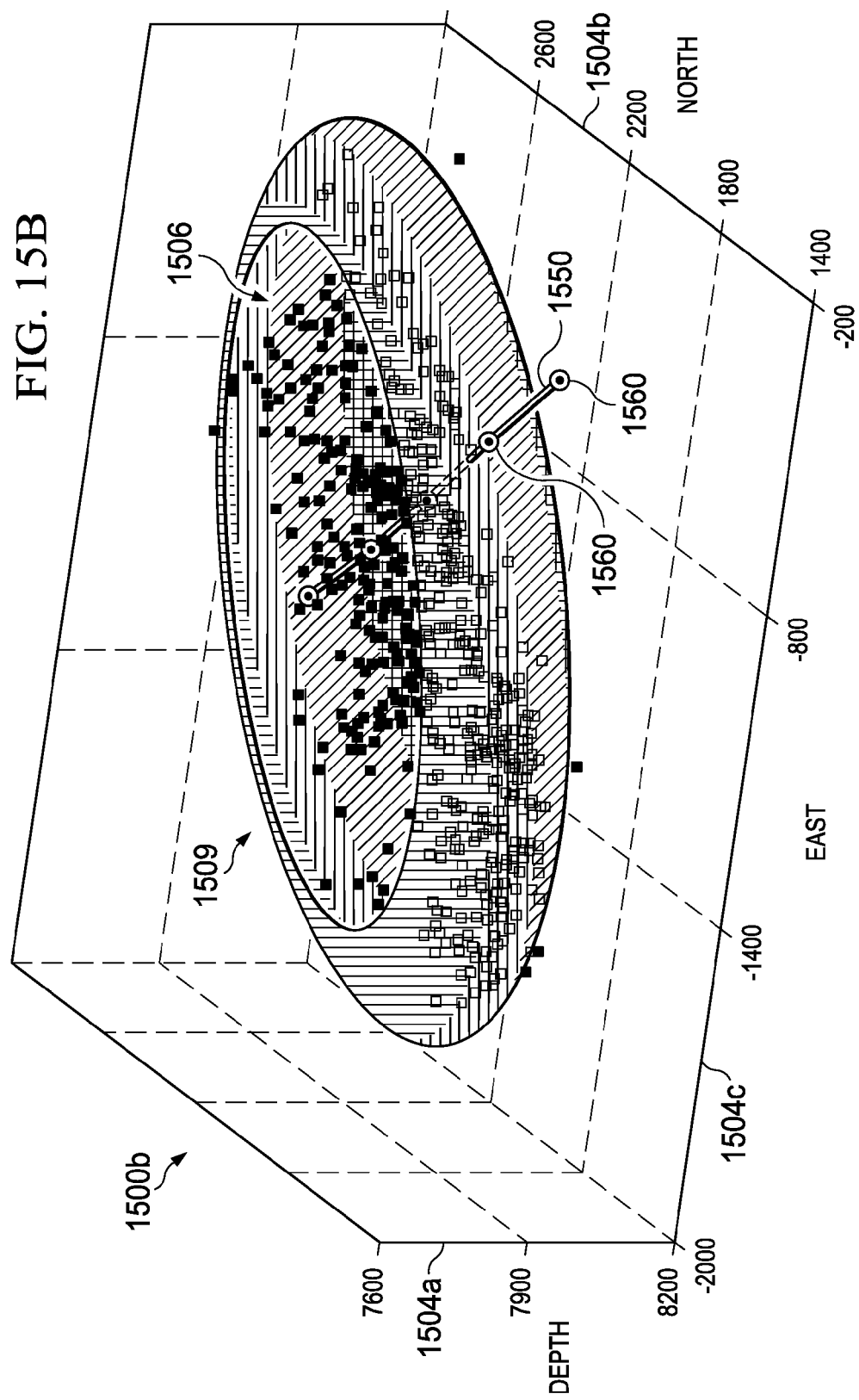
FIG. 15B is a plot showing an ellipsoid associated with the example boundary 1508 in FIG. 15A.

FIG. 15A is a plot 1500a showing an example of a boundary 1508 and its vertices 1516; FIG. 15B is a plot 1500b showing an ellipsoid 1509 associated with the example boundary 1508 in FIG. 15A. In the illustrated example, the boundary 1508 is a convex hull constructed based on the microseismic events 1506 shown in FIG. 15B. The boundary 1508 can be computed according to the example operations described with respect to FIGS. 2A-5B, or in another manner. In some implementations, suppose the boundary 1508 has n vertices 1516, the location of each vertex may be denoted as $(x_i, y_i, z_i)$, $1 \le i \le n$. In Cartesian coordinates, a general ellipsoid may be described as in equation (11)

$$a_1 x^2 + a_2 y^2 + a_3 z^2 + 2a_4 xy + 2a_5 xz + 2a_6 yz + 2a_7 x + 2a_8 y + 2a_9 z + a_{10} = 0 \quad (11)$$

with coefficients $a_1 \sim a_{10}$. The ten coefficients can be subject to the constraints: $a_4 < a_1 a_2$, $a_5 < a_1 a_3$, $a_6 < a_2 a_3$. In some implementations, to reduce the complexity, additional constraints can be applied on one or more of these parameters. For example, it can be assumed that the origin of the ellipsoid is not on the ellipsoid surface, for instance, $a_{10} \ne 0$ and equation (11) may be normalized and described as in equation (12) with nine parameters $a_1 \sim a_9$:

$$a_1 x^2 + a_2 y^2 + a_3 z^2 + 2a_4 xy + 2a_5 xz + 2a_6 yz + 2a_7 x + 2a_8 y + 2a_9 z = 1 \quad (12).$$

In some instances, the condition for fitting the ellipsoid described by equation (12) using n points (vertices) can be $n \ge 9$. Defining two vectors a, x as $$a = [a_1\ a_2\ a_3\ a_4\ a_5\ a_6\ a_7\ a_8\ a_9]^T, \quad (13\text{-a})$$

$$x = [x^2\ y^2\ z^2\ 2xy\ 2xz\ 2yz\ 2x\ 2y\ 2z]^T \quad (13\text{-b}),$$

equation (12) can have a simplified form of a dot product: $a \cdot x = 1$, where the superscript T is the transpose operation on vectors or matrices. The n points (e.g., the vertices on the boundary) can define a n×9 matrix D, $$D = \begin{bmatrix} x_1^2 & y_1^2 & z_1^2 & 2x_1y_1 & 2x_1z_1 & 2y_1z_1 & 2x_1 & 2y_1 & 2z_1 \\ x_2^2 & y_2^2 & z_2^2 & 2x_2y_2 & 2x_2z_2 & 2y_2z_2 & 2x_2 & 2y_2 & 2z_2 \\ \cdots & \cdots & \cdots & \cdots & \cdots & \cdots & \cdots & \cdots & \cdots \\ x_n^2 & y_n^2 & z_n^2 & 2x_ny_n & 2x_nz_n & 2y_nz_n & 2x_n & 2y_n & 2z_n \end{bmatrix}_{n \times 9}. \quad (14)$$

As an example, parameters a of an ellipsoid that best fits the n points in a least square sense can be calculated, for example, by solving a linear system (15):

$$D^T D\ a = D^T b, \quad (15\text{-a})$$

$$b = [1\ 1\ \ldots\ 1\ 1]^T_{n \times 1} \quad (15\text{-b}).$$

In some instances, it can be shown that a unique solution exists for this linear system (15). In some implementations, the linear system (15) can be solved analytically, for example, via an analytic (or direct) approach, or numerically, for example, via the Gaussian elimination or Gauss Jordan elimination method. Additional or different approaches can be used. In some instances, the analytic or direct approach can be time consuming and computationally complex.

In some implementations, the ellipsoid represented by the equation (12) can also be represented in a standard form:

$$\frac{x'^2}{a^2} + \frac{y'^2}{b^2} + \frac{z'^2}{c^2} = 1 \quad (16)$$

by defining $$x' = a \cos u \sin v, \quad (17\text{-a})$$

$$y' = b \sin u \cos v, \quad (17\text{-b})$$

$$z' = c \cos v, \quad (17\text{-c})$$

$$u \in [0, 360°), \quad (17\text{-d})$$

$$v \in [0, 180°) \quad (17\text{-e}),$$

and using the following linear transformations (18):

$$\begin{bmatrix} x \\ y \\ z \end{bmatrix} = R_z R_y R_x \begin{bmatrix} x' \\ y' \\ z' \end{bmatrix} + \begin{bmatrix} x_0 \\ y_0 \\ z_0 \end{bmatrix}, \quad (18\text{-a})$$

$$R_x = \begin{bmatrix} 1 & 0 & 0 \\ 0 & \cos\theta_x & -\sin\theta_x \\ 0 & \sin\theta_x & \cos\theta_x \end{bmatrix}, \quad (18\text{-b})$$

$$R_y = \begin{bmatrix} \cos\theta_y & 0 & \sin\theta_y \\ 0 & 1 & 0 \\ -\sin\theta_y & 0 & \cos\theta_x \end{bmatrix}, \quad (18\text{-c})$$

-continued $$R_z = \begin{bmatrix} \cos\theta_z & -\sin\theta_z & 0 \\ \sin\theta_z & \cos\theta_x & 0 \\ 0 & 0 & 1 \end{bmatrix}. \quad (18\text{-d})$$

Here a, b, c are lengths of semi-axes, $\theta_x$, $\theta_y$, $\theta_z$ are rotation angles around the x-axis, y-axis and z-axis, $R_x$, $R_y$, $R_z$ are rotation operations, and $(x_0, y_0, z_0)$ is the center of the ellipsoid. In some instances, the positive value of the rotation angle can represent the counterclockwise direction; the negative value can represent the clockwise direction. The following nine parameters $$a, b, c, \theta_x, \theta_y, \theta_z, x_0, y_0, z_0 \quad (19)$$

can be function parameters that can have geometrical and physical interpretations for describing the ellipsoid's properties and characterizing the geometry of the stimulated region. The values for the nine parameters can be derived based on equation (12). For example, the nine parameters in equation (12) can be presented in the form of a symmetric 4×4 matrix A $$A = \begin{bmatrix} a_1 & a_4 & a_5 & a_7 \\ a_4 & a_2 & a_6 & a_8 \\ a_8 & a_6 & a_3 & a_9 \\ a_7 & a_8 & a_9 & -1 \end{bmatrix}, \quad (20\text{-a})$$

and the equation (12) can be rewritten in a matrix form as $$X^T A X = 0, \quad (20\text{-b})$$

where $$X = \begin{bmatrix} x \\ y \\ z \\ 1 \end{bmatrix}. \quad (20\text{-c})$$

The center of the ellipsoid $(x_0, y_0, z_0)$ can be calculated by equation (21):

$$\begin{bmatrix} x_0 \\ y_0 \\ z_0 \end{bmatrix} = - \begin{bmatrix} a_1 & a_4 & a_5 \\ a_4 & a_2 & a_6 \\ a_5 & a_6 & a_3 \end{bmatrix}^{-1} \begin{bmatrix} a_7 \\ a_8 \\ a_9 \end{bmatrix}. \quad (21)$$

The translation operation of the ellipsoid by the quantities $\hat{x} = x - x_0$, $\hat{y} = y - y_0$, $\hat{z} = z - z_0$ can be given by translation matrix T, $$T = \begin{bmatrix} 1 & 0 & 0 & 0 \\ 0 & 1 & 0 & 0 \\ 0 & 0 & 1 & 0 \\ x_0 & y_0 & z_0 & 1 \end{bmatrix}, \quad (22)$$

which can transform the matrix A into another matrix A' by $$A' = TAT^T = \begin{bmatrix} a_1 & a_4 & a_5 & 0 \\ a_4 & a_2 & a_6 & 0 \\ a_5 & a_6 & a_3 & 0 \\ 0 & 0 & 0 & a_7x_0 + a_8y_0 + a_9z_0 - 1 \end{bmatrix} \quad (23)$$

For notation simplification, x, y, z will be used instead of $\hat{x}, \hat{y}, \hat{z}$ in the following. For example, defining $$\alpha = -a_5x_0 - a_6y_0 - a_7z_0 + 1, \quad (24\text{-a})$$

$$b_1 = \frac{a_1}{\alpha}, \quad (24\text{-b})$$

$$b_2 = \frac{a_2}{\alpha}, \quad (24\text{-c})$$

$$b_3 = \frac{a_3}{\alpha}, \quad (24\text{-d})$$

$$b_4 = \frac{a_4}{\alpha}, \quad (24\text{-e})$$

$$b_5 = \frac{a_5}{\alpha}, \quad (24\text{-f})$$

$$b_6 = \frac{a_6}{\alpha}, \quad (24\text{-g})$$

then the ellipsoid equation (12) with the center (0,0,0) can become $$b_1 x^2 + b_2 y^2 + b_3 z^2 + 2b_4 xy + 2b_5 xz + 2b_6 yz = 1 \quad (25)$$

and it can also be structured using a symmetric 3×3 matrix B $$Y^T B Y = 1, \quad (26\text{-a})$$

$$B = \begin{bmatrix} b_1 & b_4 & b_5 \\ b_4 & b_2 & b_6 \\ b_5 & b_6 & b_3 \end{bmatrix}, \quad (26\text{-b})$$

$$Y = \begin{bmatrix} x \\ y \\ z \end{bmatrix}. \quad (26\text{-c})$$

The three positive eigenvalues $\lambda_1$, $\lambda_2$, $\lambda_3$ of the 3×3 symmetric matrix B can be solved by analytic method but may have a complicated analytic solution. In some implementations, another approach can be used. For instance, the lengths of semi-axes can be calculated by $$a = \frac{1}{\sqrt{\lambda_1}}, \quad (27\text{-a})$$

$$b = \frac{1}{\sqrt{\lambda_2}}, \quad (27\text{-b})$$

$$c = \frac{1}{\sqrt{\lambda_3}}. \quad (26\text{-c})$$

The unit eigenvector $P_i$ for the eigenvalue $\lambda_i$, $1 \leq i \leq 3$, can be obtained, for example, by using the "power" numerical algorithm, or another technique. Three resulting eigenvectors can construct an orthonormal matrix $P = [P_1\ P_2\ P_3] = [p_{ij}]$ as follows:

$$P^T P = I_{3\times 3}, \quad (29\text{-a})$$

$$P^T B P = \begin{bmatrix} \lambda_1 & 0 & 0 \\ 0 & \lambda_2 & 0 \\ 0 & 0 & \lambda_3 \end{bmatrix}, \quad (29\text{-b})$$

$$P = R_z R_y R_x. \quad (29\text{-c})$$

Three rotation angles can be given by $$\theta_x = \tan^{-1} \frac{p_{32}}{p_{33}}, \quad (30\text{-a})$$

$$\theta_y = -\sin^{-1}(p_{31}), \quad (30\text{-b})$$

$$\theta_z = \tan^{-1} \frac{p_{21}}{p_{11}} \quad (30\text{-c})$$

where $p_{ij}$ are items of the matrix P.

The example process for calculating the functional parameters (e.g., the parameters listed in formula (19)) and identifying geometric properties of the ellipsoid can start by generating the matrix D according to equation (14), for example, by using all vertices of an SRV boundary (e.g., the convex hull 1508 in FIG. 15A). Then, solving equation (15) for vector a can yield the nine parameters $a_1 \sim a_9$ of the ellipsoid equation (12). Based on the equation (12), the center, lengths of semi-axes, and rotation angles of the ellipsoid can be obtained, for example, using equation (21), equation (27) and equation (30), respectively. Additional or different techniques can be used for deriving the parameters of the ellipsoid.

In some instances, the rotation angles along the x-axis and y-axis ($\theta_x$, $\theta_y$) can be much smaller than the rotation angle along z-axis ($\theta_z$). In some instances, for example, referring to the standard ellipsoid representation (16), out of the nine parameters in (19), four parameters of the ellipsoid may play a more important role in describing the property of the stimulated region: the length of stimulated rock, which may be quantified by the larger between 2a and 2b, the width of the stimulated rock, which may be approximated by the smaller between 2a and 2b, the height, which may be described by a value of 2c, and the rotation angle along z-axis ($\theta_z$), implicating the stimulated region's azimuth, which can be either $\theta_z$ or 90°−$\theta_z$. In some implementations, the orientation azimuth identified based on the SRV boundary can be compared, for example, with the fracture pattern azimuth identified by fracture matching technology or another technique. Additional or different parameters can be selected to characterize the SRV for the stimulated region.

In the illustrated example in FIG. 15B, the ellipsoid 1509 corresponding to the boundary 1508 in FIG. 15A has a center at (−1030.68, 2145.09, 7973.13) (feet). Its lengths of semi-axes a, b, and c are 866.43, 384.40 and 241.23 (feet), and the rotation angles are 2.14°, 1.6° and 50.1°, respectively. The top of the ellipsoid 1509 can be removed so that the microseismic events 1506 inside the ellipsoid 1509 and the wellbore 1550 and perforation clusters 1560 can be illustrated and examined. The length, width and height of the stimulated region are 1732.86, 768.8 and 482.46 (feet) according to the algorithm described above. The azimuth of the stimulated region is 90.0°−50.1°=39.9° north-to-east. In some instances, the length of the stimulated region can represent the extension of the hydraulic fracture network to the reservoir while the width can relate to the number of fractures in the primary fracture family. The azimuth of the stimulated region can represent the orientation of the primary fracture family in the subterranean region.

In some implementations, the approximated ellipsoid can be viewed as a container of microseismic events and hydraulic fractures in the stimulated region. The ellipsoid can be the boundary that contacts between the stimulated reservoir and the un-fractured reservoir. In some instances, it is very useful to provide the well operators and field engineers with visualization of hydraulic fractures, development of the hydraulic fractures, as well as the SRV boundary that captures the shape of the stimulated region and encloses the microseismic activities and the hydraulic fractures.

Figure 16A:
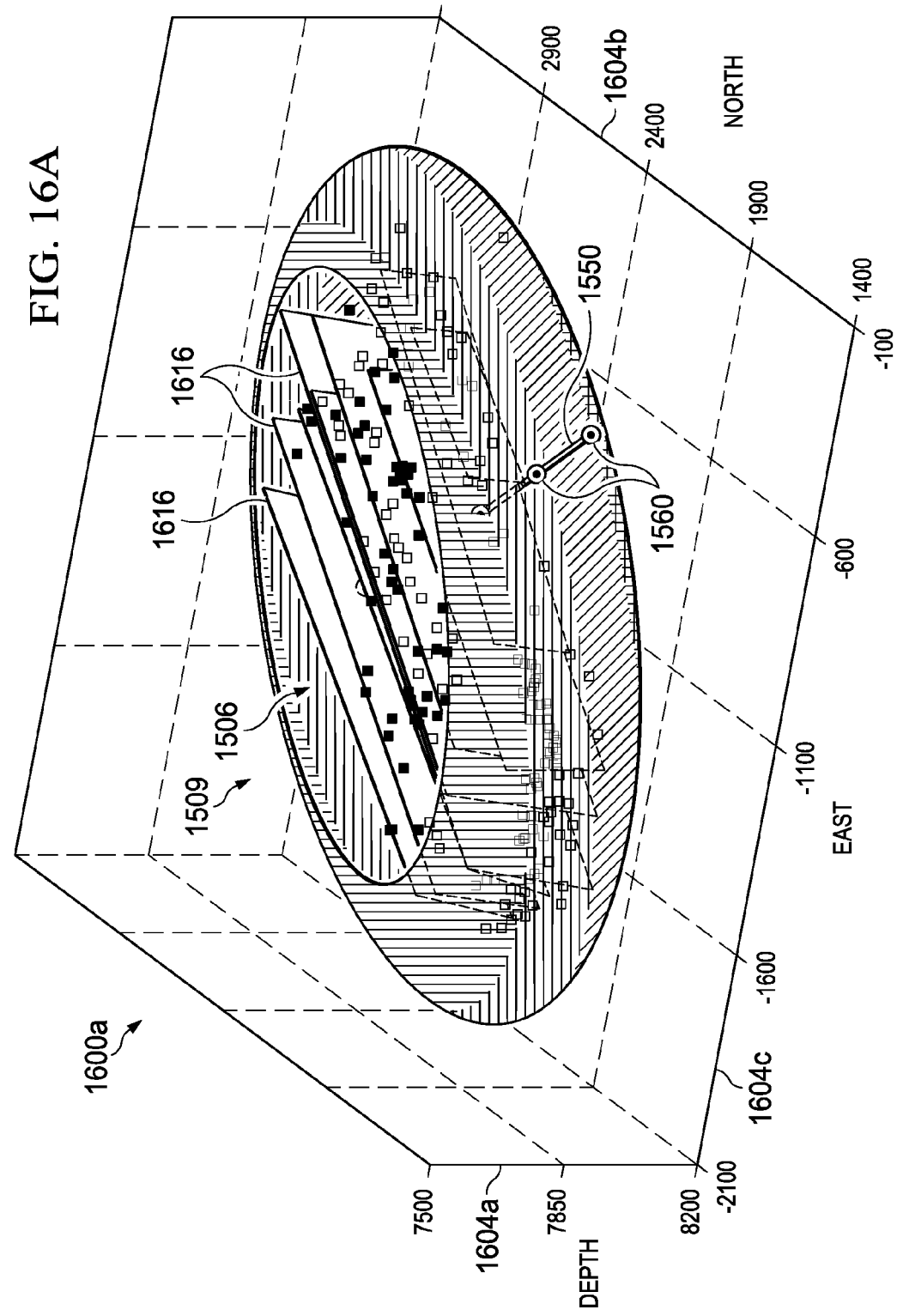
FIG. 16A is a plot showing an example of a visualization 1600a of microseismic events, hydraulic fractures, and SRV boundaries.

FIG. 16A is a plot showing a view of an example visualization 1600a of microseismic events, hydraulic fractures, and the SRV boundary. In addition to the microseismic events 1506 and the approximated ellipsoid 1509 shown in FIG. 15B, the example visualization1600a includes nine hydraulic fractures 1616 identified based on the microseismic events 1506. The hydraulic fractures 1616 can be identified, for example, by fracture matching technology, such as Halliburton's "Foray 3D Microseismic Fracture Matching Services," or other techniques may be used. In some implementations, a real-time development of the hydraulic fractures 1616 can be identified, tracked, and visually presented, for example, by Halliburton's "Foray 3D Real Time Microseismic Fracture Matching Services," or other techniques may be used. In some implementations, the characteristics of these hydraulic fractures 1616 can be described by the average values of the nine fractures 1616, for example, average azimuth 35.1°, average dip angle 76.1°, average half-length 627 (feet), average height 338 (feet), and average spacing 72.2 (feet). The fracture length, fracture spacing, and fracture height of the fracture network (e.g., characterized by the identified hydraulic fractures 1616) have a close correlation with the length, width and height of the stimulated region (e.g., characterized by the ellipsoid 1509). In the illustrated example, the average azimuth (N35.1° E) of fractures 1616 is consistent with the azimuth (N39.9° E) of the ellipsoid 1509 for the stimulated region, which confirms the correctness of the techniques described herein.

FIG. 16B is a plot showing another view 1600b of the example visualization 1600a in FIG. 16A. The view 1600b in FIG. 16B provides another perspective of the extension, spacing, and orientation of the identified fractures 1616 as well as the shape and orientation of the ellipsoid 1509, for example, relative to the wellbore 1550 and the perforation clusters 1560. In some implementations, view, perspective, size, or another display functionality of the visualization 1600a can be adjusted or otherwise controlled by a user (e.g., a well operator, a field engineer, an analyst, etc.) to facilitate their view and analysis. For example, the user may select, zoom in and out, rotate, or otherwise manage a portion of the entire visualization, for example, for close examination. In some implementations, when a specific portion (e.g., one of the identified fracture plane 1616 or the ellipsoid 1509) is selected, its attributes or parameters (e.g., azimuth, dip angle, half-length, height, and spacing or density size, extension, length, width, height, orientation, area, volume, etc.) can be displayed or otherwise output. Additional or different actions can be applied.

In some instances, the microseismic events, the fractures, and the SRV boundary can be computed and displayed in real time based on microseismic data. In some implementations, the development of the hydraulic fractures and the SRV can be approximated and tracked. In some instances, the user can visualize, for example, the propagation or growth direction, the width, the shape, or another attribute of the hydraulic fractures and the SRV. The graphic realization of the identified SRV boundary and hydraulic fractures can provide the user a direct and intuitive tool to understand the subterranean region, and evaluate, control, design, or otherwise manage the stimulation treatment. For instance, through the visualization, whether the fractures intersect or will intersect the wellbore 1550 at unexpected points or whether the fractures divert from their expected direction can be determined. In these cases, preventive actions can be taken to control the developments of the fracture network and the stimulated region. Additional or different information can be observed or otherwise extracted based on the visualization.

Figure 17:
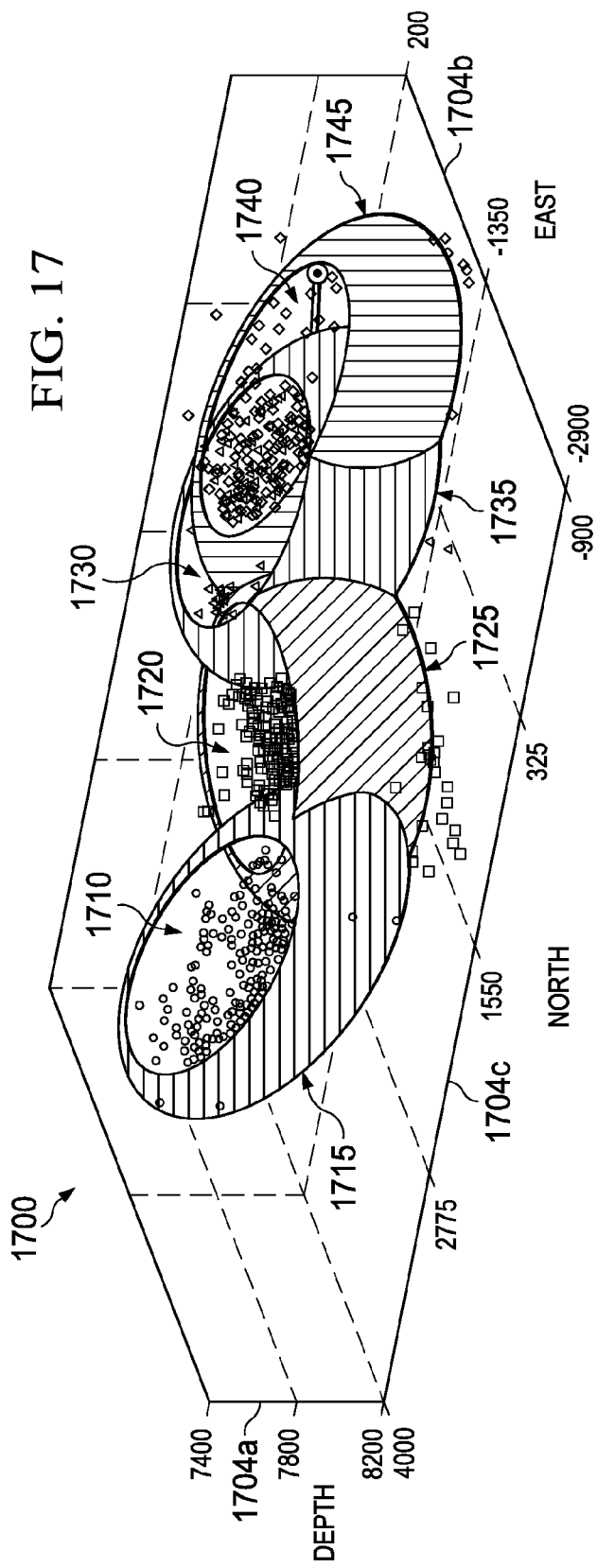
FIG. 17 is a plot showing example SRV boundaries calculated from example microseismic event data collected from a multi-stage injection treatment.

FIG. 17 is a plot 1700 showing example SRV boundaries calculated from example microseismic event data collected from a multi-stage injection treatment. The example plot 1700 shows four subsets of microseismic events: 1710 (shown as circles), 1720 (shown as squares), 1730 (shown as triangles), and 1740 (shown as diamonds) associated with stage 1, stage 2, stage 3, and stage 4 of the example four-stage injection treatment, respectively. Four SRV boundaries 1715, 1725, 1735, and 1745 are computed based on the four subsets 1710, 1720, 1730, and 1740 of the microseismic events, respectively. Each of the four ellipsoids 1715, 1725, 1735, and 1745 can be computed based on the example technique described with respect to FIGS. 15A-B, or in another manner. The tops of the illustrated ellipsoids 1715, 1725, 1735, and 1745 are removed to show the subsets of microseismic events 1710, 1720, 1730, and 1740. The ellipsoids 1715, 1725, 1735, and 1745 provide a respective 3D visualization of the geophysical shape of the SRV for each treatment stage. The size and orientation of the stimulated region for each stage, as well as SRV overlaps between stages, can be identified based on the computed ellipsoids 1715, 1725, 1735, and 1745 and their visualizations.

Figure 9:
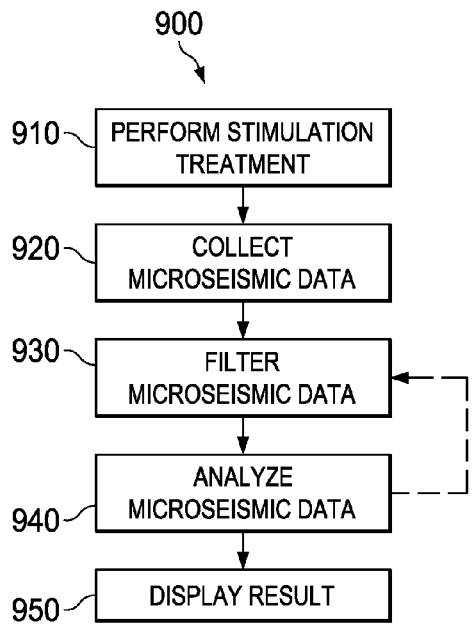
FIG. 9 is a flow chart showing an example technique for processing microseismic data.

FIG. 9 is a flow chart showing an example process 900 for processing microseismic data. All or part of the example process 900 may be computer-implemented, for example, using the features and attributes of the example computing subsystem 110 shown in FIG. 1B or other computing systems. The process 900, individual operations of the process 900, or groups of operations may be iterated or performed simultaneously to achieve a desired result. In some cases, the process 900 may include the same, additional, fewer, or different operations performed in the same or a different order. The process 900 may be performed on site near a wellbore, at a remote location, or in another location.

At 910, a stimulation treatment is performed. The stimulation treatment can be a single-stage injection treatment or a multi-stage injection treatment. The injection treatment may be performed, for example, by the well system 100 in FIG. 1A or by another type of system. The injection treatment can induce and generate microseismic events in the stimulated subterranean region.

At 920, microseismic data can be collected. The microseismic data can be collected, for example, by sensors (e.g., sensors 136 in FIG. 1A) or data collection apparatus of an injection treatment system. The microseismic data can be collected before, during, or after a stimulation treatment or at another time. In some implementations, the microseismic event data can be collected in real time (or substantially in real time) during a stimulation treatment. For example, the microseismic data may be collected at individual stages of a multi-stage injection treatment. The microseismic data can include any suitable information of microseismic events associated with a stimulation treatment of a subterranean region. In some aspects of implementations, the microseismic data can be stored in a memory (e.g., memory 150) of a computing system for storage or further processing.

In some instances, microseismic events may have low-amplitude or low-energy (e.g., with the value of the log of the intensity or moment magnitude of less than three), or a low signal-to-noise ratio (SNR). Some uncertainty, inaccuracy, or measurement error can be associated with the event locations. For example, the uncertainty can include a location uncertainty, a moment (e.g., amplitude or energy) uncertainty, a time uncertainty (e.g., the uncertainty related to associating an event with a particular treatment stage), or a combination of these and other types of uncertainty. In some implementations, the uncertainty of a microseismic event can be approximated, for example, by a ball with radius r given by equation (2), or can be described in another manner. For instance, the uncertainty may be described by a prolate spheroid or another geometrical representation, which has the highest likelihood at the center and the lowest likelihood at the edge of the geometrical representation.

At 930, microseismic data can be filtered. The microseismic data can be filtered based on times, locations, uncertainties, magnitude, moment, energy, event density, or a combination of these and other attributes of the microseismic events. In some implementations, the microseismic data can include microseismic events associated with multiple stages of a stimulation treatment. The microseismic data can be filtered, for example, by grouping microseismic events associated with respective stages of the multi-stage injection treatment. In some aspects, the microseismic data associated with the entire multi-stage injection treatment can form a superset of microseismic events; the microseismic events associated with each stage can form a respective subset. In some implementations, the microseismic data can be filtered by removing outliers from a subset, a superset, or another set of microseismic events. In some instances, the outliers can include deterministic outliers, statistical outliers, or another type of outliers. The outliers can include one or more microseismic events with locations outside a range, with uncertainty beyond a threshold, with amplitude, energy, or event density below a threshold, or with other outlier attributes. The outliers can be filtered by removing the microseismic events exceeding an attribute threshold, beyond certain statistical deviation, etc.; or outliers can be filtered in another manner. In some implementations, the attribute threshold (e.g., density threshold, distance threshold, moment threshold, etc.) can be a user input control parameter or it can be configured automatically, for example, by data processing apparatus, based on system setup, reservoir property, treatment plan, or a combination of these and other parameters.

At 940, microseismic data can be analyzed. In some implementations, the analysis can be performed based on the filtered microseismic data. In some implementations, analyzing the microseismic data can include identifying stimulated reservoir geometry, calculating an SRV for a stimulation treatment, identifying uncertainty of an SRV, fracture mapping and matching, or another type of processing. As an example, analyzing the microseismic data includes constructing a boundary of microseismic events and calculating an SRV based on the boundary. In some instances, uncertainty can be associated with the microseismic events. In this case, uncertainty associated with the SRV calculation can be identified based on the uncertainty of the microseismic events. Some example microseismic data analysis techniques are described with respect to FIGS. 2A-8 and FIGS. 10-12. Analyzing the microseismic data can include additional or different techniques.

In some implementations, filtering and analyzing the microseismic data can be an iterative process with a terminating condition. For example, after analyzing the microseismic data at 940, the process 900 may go back to 930 for further microseismic data filtering. In some instances, the filtering can be based on the analyzed result at 940. For instance, the microseismic events may be filtered by removing low event density events that are vertices of a constructed boundary at 940. The microseismic data can be filtered based on additional or different criteria. The filtered microseismic data can be analyzed at 940 again, for example, for constructing an improved boundary. In some implementations, filtering and analyzing the microseismic data can be repeated until, for example, a predefined number of iterations is reached, outliers and low density events have been filtered, or another terminating condition is reached. In some implementations, the microseismic data can be filtered and analyzed in real time (or substantially in real time) during a stimulation treatment, or at another suitable time. In some implementations, the analyzing process at 940 can include the filtering process at 930.

At 950, the analyzed result can be displayed. For instance, the analyzed result can be displayed on a screen or another type of display apparatus. In some implementations, the analyzed result can be displayed, for example, in real time (or substantially real time) as the microseismic data are analyzed, after a final result is obtained, or at another time (e.g., when requested by a user). The analyzed result can include, for example, a geometrical representation of SRV, extensions of hydraulic fractures, or a combination of these and other types of visualizations. In some instances, the analyzed result can include a quantity of calculated SRV, uncertainty or accuracy of an SRV, an overlapping volume of SRVs, a percentage of the overlapping volume over the SRV of a treatment stage or of an entire injection treatment, or other information. FIGS. 2A-8 show example displays of analyzed results. Based on the displayed result, efficiency of a stimulation treatment can be evaluated. In some instances, a current or a prospective injection plan (e.g., injection schedules of future treatment stages, parameters of injection treatment, diversion techniques, etc.) can be adjusted based on the result.

Figure 10:
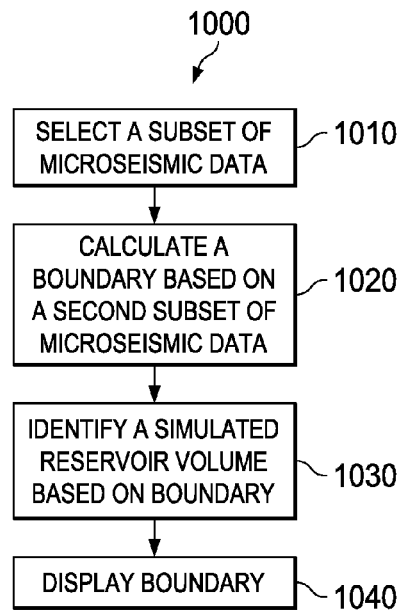
FIG. 10 is a flow chart showing an example technique for identifying an SRV from microseismic data.

FIG. 10 is a flow chart showing an example process 1000 for identifying an SRV from microseismic data. All or part of the example process 1000 may be computer-implemented, for example, using the features and attributes of the example computing subsystem 110 shown in FIG. 1B or other computing systems. The process 1000, individual operations of the process 1000, or groups of operations may be iterated or performed simultaneously to achieve a desired result. In some cases, the process 1000 may include the same, additional, fewer, or different operations performed in the same or a different order.

At 1010, a subset of microseismic events can be selected. In some implementations, the subset can be selected according to the filtering operation at 930 in FIG. 9, or in another manner. For instance, the subset of microseismic events can be selected from a superset of microseismic events based on respective locations of the subset of microseismic events. In some instances, the subset can include microseismic events whose locations are outliers in the superset of microseismic events. Additionally or differently, the subset of microseismic events can be selected based on respective event densities of the subset of microseismic events. For example, the subset can include microseismic events having event densities below a threshold density. The subset can be selected based on other criteria and may include other microseismic events.

At 1020, a boundary can be calculated to enclose the locations of at least a portion of the microseismic events not included in the selected subset at 1010. In some instances, the boundary is calculated to enclose locations of a second subset of microseismic events. The second subset of microseismic events can be different than the selected subset of microseismic events at 1010. As a specific example, the second subset may include remaining microseismic events after removing outliers, low density events, or both in the selected subset at 1010. In some implementations, the second subset can be selected from a superset of microseismic events based on respective times of the second subset of microseismic events. For instance, the second subset can include microseismic events that are associated with a single stage of a multi-stage injection treatment and the superset can include the microseismic events associated with multiple stages (e.g., all stages, or fewer than all stages) of the multi-stage injection treatment. In some instances, the second subset can be selected based on other criteria and may include other microseismic events. In some implementations, a subset hierarchy can be defined and the microseismic events can be selected in a successive manner. As a specific example, a full set can include locations of all microseismic events collected for a multi-stage injection treatment. Multiple first-layer subsets may be defined and selected such that they include locations of microseismic events associated with an individual stage of the multi-stage injection treatment. One or more second-layer subsets of locations can be selected from each of the first-layer subsets, for example, based on their respective locations, event densities, or any other attributes relative to the first-layer subset. In this case, the first-layer subset can be regarded as a superset of the one or more second-layer subsets. Additional or different layered subsets can be defined and selected.

In some implementations, the boundary can be a geometrical representation of a stimulated subterranean region and the volume of the geometrical object enclosed by the boundary can be the SRV for the stimulation treatment applied on the subterranean region. In some instances, the boundary can be a closed boundary. For example, the boundary can either intersect or contain each microseismic event in the second subset while the microseismic events in the selected subset at 1010 reside outside the boundary. In some instances, a boundary can be defined by discrete points (e.g., discrete microseismic events) or the boundary can include one or more edges, curves, facets, or a combination of these and other geometrical elements. The boundary can be of any appropriate shape, for example, a rectangle, a circle, a polygon, a sphere, an ellipsoid, a polyhedron, etc. The boundary can be convex, concave, or have other geometric properties. In some implementations, the boundary can have two dimensions, three dimensions, etc. As an example, the boundary can be a 3D convex hull (e.g., boundaries 208, 308a, 308b, 408a, 408b, or 508), 2D convex polygon (e.g., convex polygon 815, 825, 835, or 835), or an ellipsoid enclosing a set of microseismic event locations. In some implementations, a boundary may be represented by certain parameters (e.g., a center, a radius, an angle, a curvature, the number of vertices, the number of edges, etc.). The boundary can be calculated by identifying the parameters that describe the boundary.

In some implementations, the boundary can be calculated by iteratively identifying triangular facets having vertices at respective groups of the microseismic event locations. For example, the boundary can be calculated according to the example operations described with respect to FIGS. 2A-5B. The example operations include, for example, identifying initial vertices and calculating an initial boundary. The initial vertices can be the microseismic events at extreme locations, or other locations. After calculating the initial boundary, an expansion operation may be performed to expand the calculated boundary to enclose one or more microseismic events residing outside the initial boundary. The expansion operation may be repeated until a final boundary is calculated. The final boundary can intersect or contain all microseismic event locations in the second subset, or the final boundary can be configured to satisfy other criteria. In some implementations, microseismic events with low event density can be removed from the second subset. For example, a vertex of a calculated boundary with an event density below a threshold density can be removed. A refined boundary can be calculated based on the remaining microseismic events. In some implementations, the boundary can be calculated based on additional or different techniques.

In some implementations, a 2D boundary can be calculated, for example, according to a similar process described above, based on the example technique described with respect to FIG. 8, or based on additional or different techniques. For instance, calculating a 2D boundary may involve projecting 3D microseismic events onto a reference plane (e.g., the horizontal plane), for example, as given by equations (8)-(10) and computing the 2D boundary based on the projected 2D events.

At 1030, an SRV can be estimated or otherwise identified based on the calculated boundary. For example, the SRV can be identified by calculating the interior volume of the boundary. An example technique for calculating the volume of the boundary is described with respect to FIG. 5A, for example, by identifying a center of the boundary; constructing a tetrahedron whose one vertex is the center and other three vertices are the three vertices of each facet of the boundary; calculating and summing up the volumes of each constructed tetrahedron. In some implementations, additional or different techniques may be used to calculate the quantity of SRV. For example, the calculated boundary may be represented by parameters (e.g., a center, a radius, an angle, a curvature, the number of vertices, the number of edges, etc.), and the SRV can be identified by calculating a volume of the boundary, for example, based on the parameters of the boundary, a volume computation, or other considerations.

At 1040, the boundary can be displayed. In some implementations, the boundary can be displayed in the manner described with respect to 950 in FIG. 9. For instance, the boundary can be displayed as a geometric object (e.g., a convex hull, or another type of object) as shown in FIGS. 2A-5B. The calculated quantity of SRV can be displayed as well. In some instances, the boundary, the SRV quantity, or other SRV data can be displayed in real time during a stimulation treatment.

Figure 11:
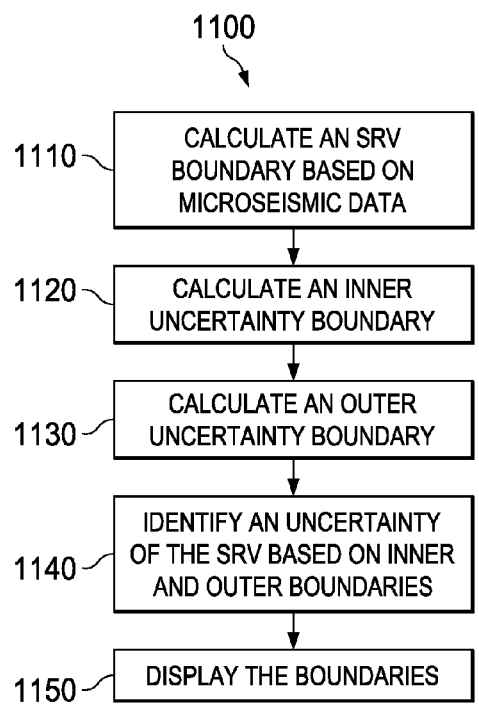
FIG. 11 is a flow chart showing an example technique for identifying uncertainty for an SRV calculation.

FIG. 11 is a flow chart showing an example process 1100 for identifying uncertainty associated with a stimulated reservoir volume (SRV) calculation. All or part of the example process 1100 may be computer-implemented, for example, using the features and attributes of the example computing subsystem 110 shown in FIG. 1B or other computing systems. The process 1100, individual operations of the process 1100, or groups of operations may be iterated or performed simultaneously to achieve a desired result. In some cases, the process 1100 may include the same, additional, fewer, or different operations performed in the same or a different order.

At 1110, an SRV boundary can be computed based on microseismic event locations. In some implementations, the microseismic events are associated with a single stage of a multi-stage injection treatment. The SRV boundary can be used to identify the SRV for the single-stage of an injection treatment. The SRV boundary can be computed according to one or more operations of the example process 1000, or in another manner. In some instances, the SRV boundary may include multiple vertices and facets. For example, the boundary 508 shown in FIG. 5A can be an example SRV boundary.

At 1120, an inner boundary can be computed. The inner boundary and the SRV boundary can be defined in a common spatial domain. The common spatial domain, for example, can be a 3D or 2D coordinate system (e.g., spherical coordinates, rectangular coordinates, etc.) or another domain. In some implementations, the inner boundary can be calculated based on uncertainties (e.g., azimuth uncertainty, distance uncertainty and depth uncertainty, moment uncertainty, time uncertainty, etc.) of the microseismic events in the common domain. For example, the inner boundary can be calculated based on respective interior points of vertices of the SRV boundary as described with respect to FIG. 5B. The interior points of the vertices can reside inside the SRV boundary with respective distances. In some instances, the respective distances can depend on the location uncertainties of the microseismic events at the vertices. For example, the respective distances may be r determined by the equation (2), or the distances can be determined in another manner. In some instances, an interior point of a vertex of the SRV boundary can lie on a segment connecting the vertex and the center of the SRV boundary. In this case, the coordinate components of the interior point can be given by equations (3-a), (3-b), and (3-c), or the interior point can reside in another location inside the SRV boundary. After identifying the interior points of the vertices of the SRV boundary, the inner boundary can be calculated, for example, by connecting the interior points, by following one or more operations of the example process 1000 based on the interior points, or by using another technique. The boundary 507 in FIG. 5B can be an example inner boundary associated with the example SRV boundary 508 in FIG. 5A, both defined in a common spatial domain with axes 504a-c.

At 1130, an outer boundary can be computed. The outer boundary and the inner boundary can be defined in the common domain. At least a portion of the outer boundary can reside outside the inner boundary. In some instances, the inner boundary resides wholly within the outer boundary. The outer boundary can be calculated based on location uncertainties of the microseismic events in the common domain. For example, the outer boundary can be calculated based on respective exterior points of vertices of the SRV boundary as described with respect to FIG. 5B. The exterior points of the vertices can reside outside the SRV boundary with respective distances. The respective distances can depend on the location uncertainties of the microseismic events at the vertices. For instance, the respective distance may be r determined by the equation (2), or the distance can be determined in another manner. In some instances, an exterior point of a vertex of the SRV boundary can lie on a ray starting from the center of the SRV and extending through the vertex. In this case, the coordinate components of the exterior point can be given by equations (4-a), (4-b), and (4-c), or the exterior point can reside in another location outside the SRV boundary. After identifying exterior points of the vertices of the SRV boundary, the outer boundary can be computed, for example, by connecting the exterior points, by following one or more operations of the example process 1000 based on the exterior points, or by using another suitable technique. The boundary 509 in FIG. 5B can be an example outer boundary associated with the example SRV boundary 508 in FIG. 5A, both defined in the common spatial domain with axes 504a-c.

In some implementations, the SRV boundary, the inner boundary, or the outer boundary can be of any suitable dimension, for example, based on the spatial domain that they reside in. For example, in some instances, the common spatial domain of the SRV boundary, the inner boundary, and the outer boundary can include a three-dimensional space, and the three boundaries can be three-dimensional boundaries (e.g., as shown in FIGS. 5A-B). In some other instances, the common domain can include a two-dimensional space, and the three boundaries can be two-dimensional boundaries.

At 1140, an uncertainty of the SRV can be identified based on the inner and outer boundaries. In some instances, the uncertainty of the SRV can be identified as a difference in volume between the inner and outer boundaries. For example, an uncertainty of the SRV associated with the boundary 508 can be the difference in volume between the inner boundary 507 and the outer boundary 509 as shown and described with respect to FIG. 5B. The uncertainty of SRV may be calculated based on additional or different measurement. In some implementations, additional or different data can be calculated. For example, the percentage of the uncertainty of the SRV over the SRV quantity can be calculated and serve as an accuracy measurement or a confidence level associated with the SRV calculation.

At 1150, one or more of the SRV boundary, the inner boundary, or the outer boundary can be displayed. In some implementations, one of the boundaries can be displayed in the manner described with respect to 950 in FIG. 9. For instance, one or more of the boundaries can be displayed as geometric objects (e.g., the boundaries 508, 507, or 509 as shown in FIGS. 5A-B). In some implementations, the calculated SRV quantities associated with each boundary, the calculated SRV uncertainty, the percentage of the uncertainty over the SRV quantity, or a combination of these and other types of information can be displayed. In some instances, one or more of the boundaries, the SRV quantity associated with each boundary, the SRV uncertainty, or other appropriate information can be displayed in real time during a stimulation treatment.

Figure 12:
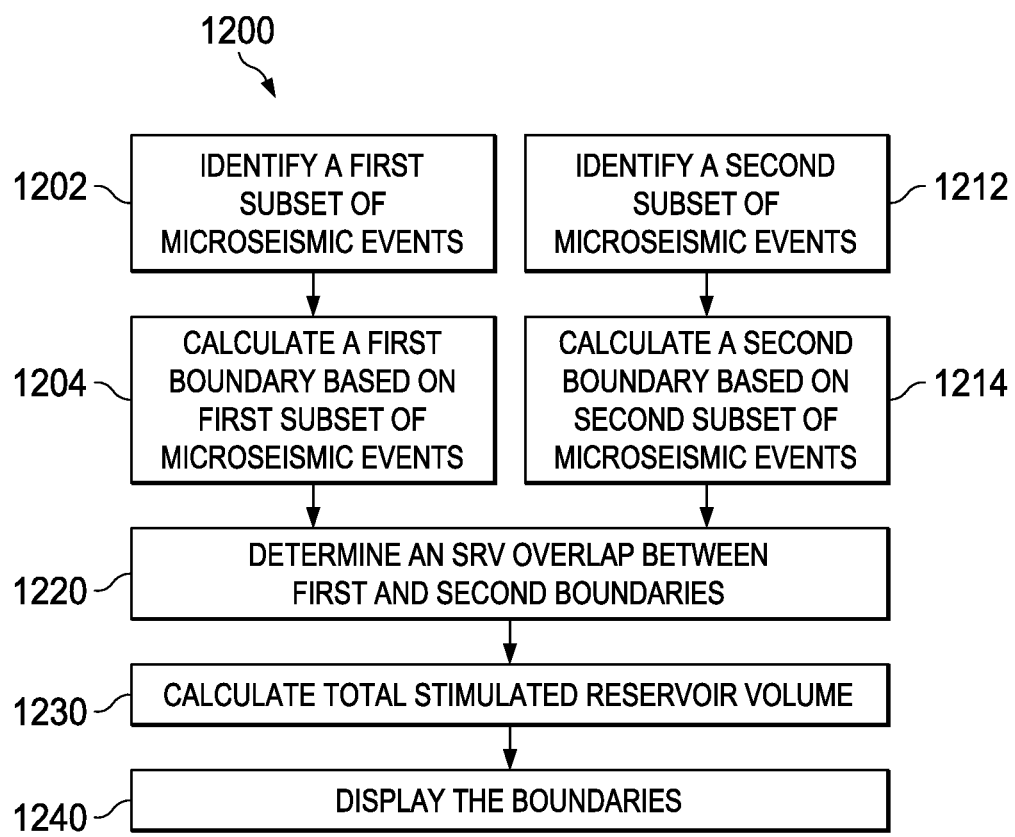
FIG. 12 is a flow chart showing an example technique for identifying overlapping SRVs.

FIG. 12 is a flow chart showing an example process 1200 for identifying overlapping stimulated reservoir volumes. All or part of the example process 1200 may be computer-implemented, for example, using the features and attributes of the example computing subsystem 110 shown in FIG. 1B or other computing systems. The process 1200, individual operations of the process 1200, or groups of operations may be iterated or performed simultaneously to achieve a desired result. In some cases, the process 1200 may include the same, additional, fewer, or different operations performed in the same or a different order.

At 1202, a first subset of microseismic events can be identified. The first subset of microseismic events can be associated with a first stage of a multi-stage injection treatment of a subterranean region. In some implementations, the first subset of microseismic events can be selected from a superset of microseismic events based on their respective times being within a first time range associated with the first stage. The first subset can be, for example, one of the subsets 610, 620, 630 and 640 of microseismic events associated with a first, second, third and fourth stage of the multi-stage injection treatment in FIG. 6, respectively. The first subset may be selected from the superset based on any additional or different criteria (e.g., location, event density, magnitude, moment, energy, or another suitable property).

At 1204, a first boundary can be calculated based on locations of microseismic events in the first subset. In some implementations, the first boundary can be calculated according to one or more operations in the example process 1000 or another technique. The first boundary can be a geometrical representation of the SRV for a first stage of a multi-stage injection treatment. For instance, the first boundary can be a corresponding boundary 710, 720, 730, or 740 in FIG. 7 given the first subset of microseismic events selected at 1202. The SRV for the first stage injection treatment can be identified based on the first boundary.

At 1212, a second subset of microseismic events can be identified. The second subset of microseismic events can be associated with a second stage of the multi-stage injection treatment. In some implementations, the second subset can be selected from the superset based on their respective times being within a second time range associated with the second stage. The second subset can be, for example, another of the subsets 610, 620, 630 or 640 of microseismic events in FIG. 6. The second subset may be selected from the superset based on any additional or different criterion (e.g., location, event density, magnitude, energy, or any suitable property).

At 1214, a second boundary can be calculated based on locations of microseismic events in the second subset. In some implementations, the second boundary can be calculated according to one or more operations in the example process 1000, or another technique. The second boundary can be a geometrical representation of SRV for a second stage of a multi-stage injection treatment. For instance, the second boundary can be a corresponding boundary 710, 720, 730, or 740 in FIG. 7 given the second subset selected at 1212. The SRV for the second stage injection treatment can be identified based on the second boundary. In some instances, the first and second boundaries are calculated in a common spatial domain. The common spatial domain can be a two-dimensional space or a three-dimensional space. In some implementations, the second subset of microseismic events and the second boundary can be associated with a stage that is performed before, during, or after the stage associated with the first boundary. For example, when events belonging to an earlier performed stage do not support well for an SRV boundary or SRV for this stage, the example process 1200 can start with a later performed stage and compute an SRV boundary for the later stage. The SRV boundary or the SRV for the earlier stage can be determined after the determination of the SRV of the later stage.

At 1220, based on the first and second boundaries, an overlap between SRVs associated with the first and second stages can be determined. In some implementations, such a determination can include determining whether the first and second boundaries intersect. In some implementations, identifying the overlap between the two boundaries can involve proper intersection, union, or other operations of the two boundaries. In some instances, the overlap between the two boundaries can be identified based on the example procedure described with respect to FIGS. 6 and 7. For example, the first and second subsets of microseismic events can be scanned to identify microseismic events that lie inside both of the first and second boundaries. In some implementations, intersected points that are intersected by one facet of a first boundary and one edge of the second boundary can be identified. Similarly, intersected points that are intersected by one facet of the second boundary and one edge of the first boundary can be identified as well. Based on the identified microseismic events inside both boundaries and the identified intersected points, a third boundary can be constructed to represent the overlap between the first and second boundaries. The volume of the third boundary can be calculated, for example, as the overlapping volume of the SRVs between the first and second stages. In some implementations, additional or different techniques can be used for determining the overlap between the SRVs associated with the first and second stages.

In some instances, a percentage of the overlapping SRV volume over the respective SRV quantities of the first or second stage can be calculated. The percentage of overlapping volumes over the SRV can quantify the treatment stage's efficiency of hydraulic fracture efforts. In some implementations, uncertainty of the overlapping SRV may be calculated, for example, according to the example process 1100 or another technique. Additional or different metrics can be calculated, for example, to reflect communication of hydraulic fractures between multiple stages.

At 1230, a total SRV can be calculated based on the SRVs associated with the first and second stages and the overlap. In some implementations, the total SRV of a multi-stage injection treatment can be calculated by summing up individual SRVs of each single stage and subtracting the SRV overlap between adjacent stages. As an example, the total SRV for a two-stage treatment can be calculated according to equation (6). In some implementations, the total SRV may be calculated according to a variation of equation (6) (for example, including a scaling factor, a weight, or another parameter), or in a different manner. In some instances, a percentage of the overlapping SRV volume over the total SRV of the multi-stage stage injection treatment can be calculated. In some implementations, the percentage of each stage's SRV over the total SRV can be calculated, which can characterize the contribution of the treatment effects of the current stage's hydraulic fracturing stimulation to the hydrocarbons productivity of the overall treatment well. In some implementations, uncertainty of the total SRV can be calculated. Additional or different metrics can be calculated to reflect, for example, efficiency of the multi-stage injection treatment.

At 1240, one or more of the first, second, or third boundaries can be displayed. In some implementations, the boundaries can be displayed according to the example process at 950 in FIG. 9. For instance, one or more of the boundaries can be displayed as geometric objects (e.g., the boundaries 710, 715, 720, 725, 730, 735, or 740 as shown in FIG. 7). In some implementations, the calculated SRV values associated with each boundary, the overlapping volume of SRVs between two boundaries, the total SRV value for the entire injection treatment, a percentage of the overlapping SRV volume, uncertainty of the overlapping SRV or total SRV, or a combination of these and other types of information can be displayed. In some instances, one or more of the boundaries, the SRV values, or other information can be displayed in real time during a stimulation treatment.

Although the example process 1200 involves a two-stage injection treatment, the example process 1200 can be adapted to more than two injection treatments or two stages of injection treatment. For example, a stimulation treatment or a stage of injection treatment may intersect with more than one other injection treatment or stage of injection treatment. Overlaps among the SRVs associated with more than two injection treatments can be identified. A total SRV of the multiple injection treatments or a multi-stage injection treatment can be calculated based on the SRVs for each stage and the overlaps, for example, according to equation (7) or in another manner.

Figure 13:
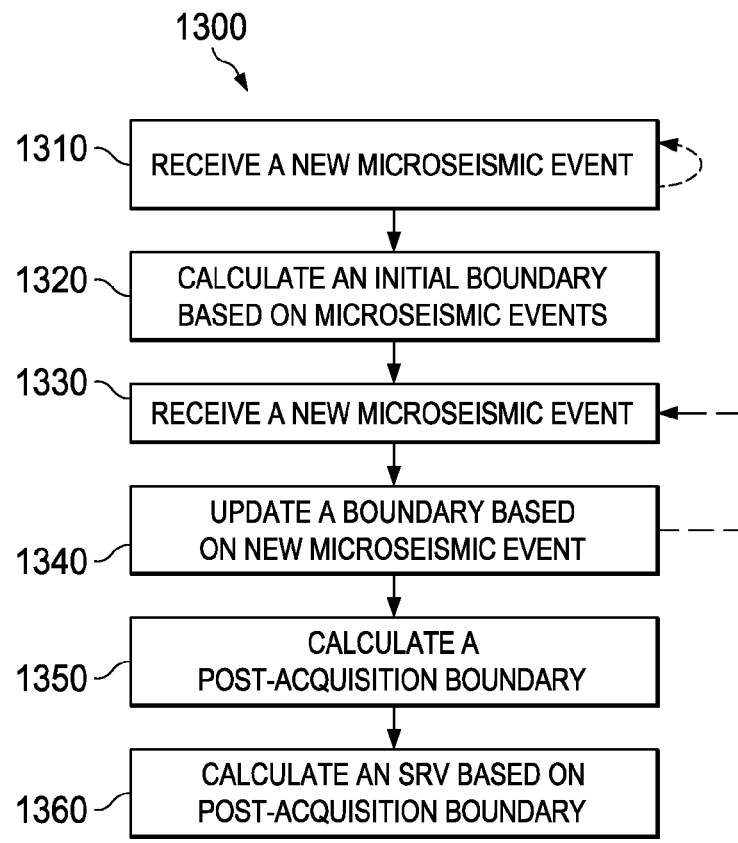
FIG. 13 is a flow chart showing an example technique for calculating SRV in real time.

FIG. 13 is a flow chart showing an example process 1300 for real-time SRV calculation. All or part of the example process 1300 may be computer-implemented, for example, using the features and attributes of the example computing subsystem 110 shown in FIG. 1B or other computing systems. The process 1300, individual operations of the process 1300, or groups of operations may be iterated or performed simultaneously to achieve a desired result. In some cases, the process 1300 may include the same, additional, fewer, or different operations performed in the same or a different order.

At 1310, data for a new microseismic event is received. In some instances, the new microseismic event is received in real time during a stimulation treatment. The new microseismic event data can be stored in a buffer or other type of memory for further processing. In some implementations, the location of the new microseismic event can be determined and its distances to one or more perforation clusters of the injection treatment can be calculated and compared. A perforation cluster may include one or more perforations. In some implementations, the new microseismic event can be associated with the perforation cluster that has the minimum distance and the event can become a supporting event of the perforation cluster. In some instances, the example process 1300 may not proceed to 1320 until enough data for new microseismic events have been received. For instance, a minimum number of events (e.g., supporting events of a perforation) may need to be accumulated before executing example operation at 1320.

At 1320, an initial boundary can be computed based on the microseismic events. In some instances, the initial boundary can be associated with a perforation cluster. The initial boundary can be calculated based on the supporting events of the perforation cluster. As an example, the initial boundary can be a tetrahedron constructed based on four supporting events of a perforation cluster. The initial boundary can be of another shape, and it can be calculated based on another number of events, for example, according to one or more operations of the example process 1000. In some implementations, an injection treatment or a stage of an injection treatment may contain more than one perforation clusters. In this case, more than one initial boundary can be calculated based on respective supporting events of the multiple perforation clusters. In some instances, the perforation cluster can be regarded as the center of the calculated initial boundary.

At 1330, data for a new microseismic event is received. The new microseismic event data can be received in real time during the stimulation treatment. In some implementations, the new microseismic event can be received after one or more boundaries (e.g., initial boundaries) have been computed. The one or more boundaries can be previously computed to enclose locations of prior microseismic events associated with the stimulation treatment.

At 1340, a boundary is modified based on the data for the new microseismic event. In some implementations, modifying the boundary includes merging two or more boundaries into a single boundary, for example, based on the location of the new microseismic event relative to the centers of the two or more boundaries. As an example, two boundaries may be merged together if a difference between the distances from the new event to the centers of the two boundaries is less than a threshold distance. Two or more boundaries may be merged based on other criteria. In some instances, the initial boundaries associated with respective perforation clusters can be merged into a single boundary representing a stimulated volume for the received microseismic events. In some instances, if the new microseismic event resides inside a boundary, the boundary may not need to be modified. If the new microseismic event resides outside a boundary, the boundary can be identified and modified to enclose the new microseismic event, for example, based on a facet expansion operation or other techniques. An SRV can be identified and updated based on the calculated boundary in real time.

In some instances, modifying the boundary can include updating a selected subset of the microseismic events based on the data for the new microseismic event, and calculating the boundary based on the updated subset. In some instances, the selected subset of microseismic events can be updated by identifying and removing outliers and microseismic events with low event density. Outliers and low density events can be removed, for example, during a stimulation treatment, after acquiring of microseismic event data, or from time to time. The outliers and microseismic events can be identified, for example, based on the respective statistical properties, tagged probabilities, or another attribute.

In some implementations, an uncertainty level (e.g., a probability) may be associated with a new microseismic event. Based on the uncertainty of the microseismic event, uncertainty of the identified SRV quantity may be calculated and updated in real time. In some aspects, the uncertainty of the SRV may be used to monitor the accuracy of the real-time SRV calculation as microseismic events accumulate in time.

In some instances, operations at 1330 and 1340 can be repeated until no more new microseismic events are received, until a predetermined time, or until another terminating condition. The boundary can keep expanding as new microseismic event data gradually accumulate. In some implementations, as more microseismic event data accumulate in time, the SRV estimation based on the updated boundary can become more accurate. In some instances, the real-time SRV calculation algorithm can produce an SRV estimation with monotonically increasing accuracy.

At 1350, a post-acquisition boundary is calculated. The post-acquisition boundary can be a boundary computed after the microseismic data acquisition. In some implementations, a filtering operation (e.g., the filtering operation at 930 in FIG. 9) can be applied to some or all of the acquired microseismic event data. The post-acquisition boundary can be calculated based on remaining microseismic events after filtering out, for example, deterministic outliers, statistical outliers, low density events, or other microseismic events.

At 1360, an SRV is calculated based on the post-acquisition boundary. In some instances, the volume enclosed by the post-acquisition boundary is calculated as the SRV for the associated injection treatment. The SRV can be calculated based on the example process described with respect to FIG. 5A or in another manner. In some implementations, post-acquisition uncertainty of the SRV or other information can be calculated.

In some implementations, the received new microseismic events and the calculated boundary can be displayed in real time during the stimulation treatment. For example, each time data for a new microseismic event is received, it can be displayed as a geometrical object (e.g., a dot) in a spatial domain, for example, as shown in FIG. 2A or 5A. A boundary, its corresponding SRV quantity, uncertainty of the SRV, or other data can be calculated, updated, and displayed accordingly based on received microseismic event data. In some cases, the dynamic propagation and growth of the boundary can be displayed in real time. Users (e.g., field engineers, operational engineers and analysts, and others) can visualize the geometry of SRV and identify the temporal and spatial evolution of SRV in a real time fashion. In some implementations, based on the observation of SRV evolution, injection treatment can be managed and adjusted accordingly to control the SRV development to maximize the SRV and formation production.

Figure 14:
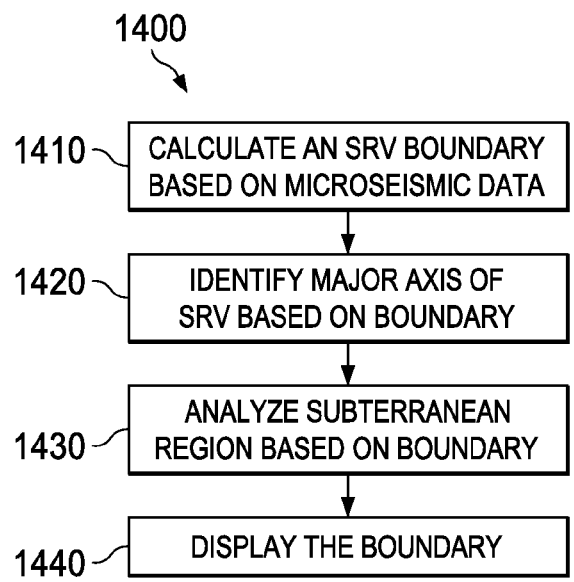
FIG. 14 is a flow chart showing an example technique for identifying geometric properties of SRV for a stimulated subterranean region.

FIG. 14 is a flow chart showing an example process 1400 for identifying geometric properties of SRV for a stimulated subterranean region. All or part of the example process 1400 may be computer-implemented, for example, using the features and attributes of the example computing subsystem 110 shown in FIG. 1B or other computing systems. The process 1400, individual operations of the process 1400, or groups of operations may be iterated or performed simultaneously to achieve a desired result. In some cases, the process 1400 may include the same, additional, fewer, or different operations performed in the same or a different order.

At 1410, an SRV boundary is approximated or otherwise computed based on microseismic event data. The SRV boundary can be used to capture the geophysical shape of a stimulated subterranean region and to characterize the geometric properties of the SRV for the stimulated subterranean region. In some instances, the SRV boundary can act as a container of identified microseismic events and stimulated hydraulic fractures (e.g., hydraulic fractures identified by fracture matching techniques). In some instances, the SRV boundary can be a boundary and interface between the stimulated fracture network and the un-fractured subterranean region. The SRV boundary can include, for example, an ellipsoid, a sphere, a cube, a cylinder, a polyhedron, a combination of them, etc. The SRV boundary can be symmetric, asymmetric, convex, concave, open, closed, or a combination of these and other properties. The ellipsoid 1509 in FIGS. 15B and 16A-B is an example SRV boundary.

In some implementations, the SRV boundary can be calculated based on the example techniques described with respect to FIGS. 15-17, one or more operations of the example process 1000, or in another manner. In some implementations, the SRV boundary can be computed such that it can fit a set of microseismic event locations. In some implementations, the set of microseismic locations can be selected from the microseismic events collected for a stimulation treatment. The set of microseismic event locations can include, for example, the vertices of a computed SRV boundary (e.g., the convex hull 1508 in FIG. 15), locations of microseismic events that reside around (e.g., within a threshold distance to) a computed SRV boundary, locations of microseismic events that reside beyond or about a threshold distance away from a reference point (e.g., the center of the collected microseismic events, the wellbore, the perforation clusters), or other locations. The SRV boundary can be computed based on post or real-time microseismic data, or a combination of both. The SRV boundary can be computed in real time during the stimulation treatment.

Taking an ellipsoidal SRV boundary as an example, an ellipsoid can be computed, for example, to fit the vertices of a computed convex hull. In some implementations, the ellipsoid can be represented by a general ellipsoid equation (12) with parameters $a_1 \sim a_9$. The parameters can be numerically solved using, for example, a least square approach (e.g., based on equation (15)) so that the vertices have the minimum distances to the ellipsoid. Numerical methods of Gaussian elimination or Gauss Jordan elimination, or another technique can be used to solve the linear system (15) to solve for the parameters $a_1 \sim a_9$ and in turn obtain the ellipsoid. Additional or different techniques can be used to compute an ellipsoid based on the microseismic event locations. As mentioned above, in addition to ellipsoids, other shapes of geometrical objects (e.g., a sphere, a cube, a polyhedron, a cylinder, etc.) can be computed for characterizing the geometric properties of the SRV for the stimulated region. The other shapes can be computed, for example, in a similar or different manner from the process described with respect to the ellipsoid.

At 1420, a major axis of the SRV is identified based on the boundary. In some instances, the major axis of the SRV can represent the lateral extension and orientation of the SRV for the stimulated region. In some instances, the major axis can reflect the lateral extension and orientation direction of the primary fracture in the stimulated region. In some implementations, based on the computed boundary that captures the geophysical shape of the SRV, a major axis of the boundary can be identified as the major axis of the SRV. For example, if the computed boundary is a cylinder (e.g., a circular cylinder, an elliptic cylinder, etc.), the axis along the height of the cylinder can be identified as the major axis of the SRV. If the computed boundary is an ellipsoid, at least one of the three semi-axes of the ellipsoid can be the major axis. For example, the three semi-axes can reflect the length, width, and height of the SRV and the axis along the length of the SRV can be identified as the major axis of the SRV. The major axis of another type of boundary can be identified.

In the exemplary case of an ellipsoidal boundary, identifying the major axis of an ellipsoid can include, for example, transforming the general ellipsoid equation (12) into another standard ellipsoid representation, e.g., equation (16) with another nine parameters as shown in formula (19). As an example implementation, the transformation can involve calculation of eigenvalues and eigenvectors of matrices. The "power" computational approach or another technique can be used for finding eigenvalues and eigenvectors of matrices. Among the nine parameters listed in formula (19), four parameters can be identified and given more weight in describing the geometric properties of the ellipsoid: lengths of semi-axes (a, b, c) that can describe the length, width and height of the SRV and the rotation angle along the x-axis that can represent the orientation's azimuth of the SRV. These parameters can be calculated, for example, according to equations (27) and (30). In some implementations, the larger value between 2a and 2b can be identified as the length of the ellipsoid. The major axis of the ellipsoid can include the semi-axis that corresponds to the length of the ellipsoid. Additional or different techniques can be used to identify the major axis of the ellipsoid. In some implementations, beside the major axis, other parameters or properties of the SRV boundary can be identified, for example, during the example operations 1410 and 1420. For instance, besides the four described above, the other five parameters out of the nine parameters in formula (19) (e.g., the center and the rotation angles around the y-axis and z-axis of the ellipsoid) can be identified, for example, according to equations (21) and (25). These parameters can be interpreted and used, for example, at 1430 for analyzing the subterranean region.

At 1430, the subterranean region is analyzed based on the boundary. In some implementations, analyzing the subterranean region can include analyzing the volume and other geometric properties of the SRV for the stimulated region. For example, the volume of the boundary (e.g., the ellipsoid) can be calculated as the SRV for the stimulated region. In some implementations, the volume of the boundary can be calculated based on one or more of the identified major axis and other parameters (e.g., the length, width, height, radius, orientation, etc.) of the boundary according to certain volume computation techniques, the example process 1030 in FIG. 10, or in another manner. In some instances, the volume can be easier to calculate based on the identified geometric properties of the SRV.

In some implementations, analyzing the subterranean region can include identifying or otherwise analyzing one or more of a length, a width, a height, or an orientation of the SRV for the stimulation treatment of the subterranean region, for example, based on the geometry parameters or properties of the boundary. For instance, the length, width, and height of the computed boundary can be used to approximate the length, width, and height of the stimulated region, respectively. In some instances, the length of the stimulated region can represent the extension of the hydraulic fracture network to the reservoir while the width can relate to the number and the spacing of fractures in the primary fracture family. In some instances, the orientation of the major axis of SRV can represent the orientation of the primary fracture family in the subterranean region. For example, analyzing the subterranean region can include identifying or otherwise analyzing the fracture orientation associated with the stimulation treatment of the subterranean region based on the major axis. In some implementations, analyzing the fracture orientation can include comparing the orientation of the SRV identified based on the major axis with the orientation of the hydraulic fractures identified based on, for example, fracture matching techniques. In some implementations, one of the two identified orientations can be used as a baseline to assess or confirm the correctness of the other.

In some implementations, analyzing the subterranean region includes analyzing whether the identified length, width, height, orientation, or another property of the SRV meet a respective criterion that reflects a desired length, width, height, orientation, or another property for the stimulation treatment. In some implementations, hydrocarbon productivity of the stimulated region can be predicted, calculated, or otherwise analyzed and the stimulation treatment can be adjusted or otherwise controlled, for example, based on the analyses of the subterranean region.

In some implementations, an uncertainty of the identified boundary, the identified volume, major axis, or any other geometric properties of the SRV for the stimulated region can be identified, for example, based on the uncertainty (e.g., in location, moment, time, etc.) of the microseismic events. In some implementations, the uncertainties can be identified according to one or more example operations of the process 1100, based on probabilities, or in another manner.

In some implementations, the stimulation treatment can include a multi-stage injection treatment, and the example process 1400 can include computing a respective boundary for each stage of the multi-stage injection treatment (e.g., the ellipsoids 1715, 1725, 1735, and 1745 in FIG. 17) and identifying a major axis for a respective SRV for each stage based on the respective boundary. In some implementations, overlapping volume of SRVs between two boundaries, the total SRV value for the entire injection treatment, a percentage of the overlapping SRV volume, uncertainty of the overlapping SRV or total SRV, or a combination of these and other types of information can be calculated, for example, according to the example processes 1200, 1300, or in another manner.

At 1440, the boundary is displayed. In some implementations, the boundary can be displayed according to the example process 950 in FIG. 9. In some implementations, the boundary can be a container of the microseismic events and identified hydraulic fractures. In some implementations, the boundary, the microseismic events, and the hydraulic fractures can be displayed in the same domain, for example, as the visualization 1600a or 1600b shown in FIGS. 16A-B. The boundary, the microseismic events, and identified hydraulic fractures can be displayed in another manner. In some implementations, the view of the boundary, microseismic events, and identified hydraulic fractures can be selected, rotated, enlarged, adjusted, or otherwise controlled by the user, for example, as described with respect to FIGS. 16A-B. For example, a user may be allowed to open any facet of the SRV boundary to observe microseismic events and identified hydraulic fractures inside of the SRV boundary. In some instances, the stimulation treatment can include a multi-stage injection treatment and the identified SRV boundaries and microseismic events can be displayed, for example, as shown in FIG. 17 or in another manner. In some implementations, the volumes and other geometric properties (e.g., the major axis, length, width, height, etc.) of each SRV boundary, the overlapping volume of SRVs between two boundaries, uncertainty of the volume or any other geometric properties of the SRV for the stimulated region, or a combination of these and other types of information can be displayed. In some instances, one or more of the boundaries, the microseismic events, the identified hydraulic fractures, or other information can be displayed in real time during a stimulation treatment. For instance, the developments of the microseismic events, the hydraulic fractures, and the SRV can be displayed. The visualization can provide detailed and quantified information of the SRV and help the field engineers and well operators extract more accurate information (e.g., the lateral extension and development of SRV at each stage) about the subterranean region and the stimulation treatment.

In some implementations, some or all of the operations in the example processes (e.g., processes 900, 1000, 1100, 1200, 1300, or 1400) are executed in real time during a fracture treatment. An operation can be performed in real time, for example, by performing the operation in response to receiving data (e.g., from a sensor or monitoring system) without substantial delay. An operation can be performed in real time, for example, by performing the operation while monitoring for additional microseismic data from the stimulation treatment. Some real-time operations can receive an input and produce an output during a fracture treatment; in some instances, the output is made available to a user within a time frame that allows the user to respond to the output, for example, by modifying the fracture treatment.

In some cases, some or all of the operations in the example processes (e.g., processes 900, 1000, 1100, 1200, 1300, or 1400) are executed dynamically during a fracture treatment. An operation can be executed dynamically, for example, by iteratively or repeatedly performing the operation based on additional inputs, for example, as the inputs are made available. In some instances, dynamic operations are performed in response to receiving data for a new microseismic event (or in response to receiving data for a certain number of new microseismic events, etc.).

Some implementations of subject matter and operations described in this specification can be implemented in digital electronic circuitry, or in computer software, firmware, or hardware, including the structures disclosed in this specification and their structural equivalents, or in combinations of one or more of them. Some implementations of subject matter described in this specification can be implemented as one or more computer programs, i.e., one or more modules of computer program instructions, encoded on computer storage mediums for execution by, or to control the operation of, data processing apparatus. A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, as well as declarative or procedural languages. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and are interconnected by a communication network.

Some of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and processors of any kind of digital computer. Generally, a processor will receive instructions and data from a read only memory or a random access memory or both. A computer includes a processor for performing actions in accordance with instructions and one or more memory devices for storing instructions and data. A computer may also include, or be operatively coupled to receive data from or transfer data to, or both, one or more mass storage devices for storing data, e.g., magnetic, magneto optical disks, or optical disks. However, a computer need not have such devices. Devices suitable for storing computer program instructions and data include all forms of non-volatile memory, media and memory devices, including by way of example semiconductor memory devices (e.g., EPROM, EEPROM, flash memory devices, and others), magnetic disks (e.g., internal hard disks, removable disks, and others), magneto optical disks , and CD ROM and DVD-ROM disks. The processor and the memory can be supplemented by, or incorporated in, special purpose logic circuitry.

To provide for interaction with a user, operations can be implemented on a computer having a display device (e.g., a monitor, or another type of display device) for displaying information to the user and a keyboard and a pointing device (e.g., a mouse, a trackball, a tablet, a touch sensitive screen, or another type of pointing device) by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

A client and server are generally remote from each other and typically interact through a communication network. Examples of communication networks include a local area network ("LAN") and a wide area network ("WAN"), an inter-network (e.g., the Internet), a network comprising a satellite link, and peer-to-peer networks (e.g., ad hoc peer-to-peer networks). The relationship of client and server arises by virtue of computer programs running on the respective computers and having a client-server relationship to each other.

While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented in multiple implementations separately or in any suitable subcombination.

A number of examples have been described. Nevertheless, it will be understood that various modifications can be made. Accordingly, other implementations are within the scope of the following claims.

The invention claimed is:

1. A method comprising:
   collecting, by a microseismic event sensor, microseismic event data representing locations of microseismic events associated with a stimulation treatment of a subterranean region;
   computing, by operation of data processing apparatus, first and second boundaries based on the locations of microseismic events associated with the stimulation treatment of the subterranean region, the first and second boundaries defined in a common spatial domain, at least a portion of the second boundary residing outside the first boundary;
identifying an uncertainty associated with a stimulated reservoir volume (SRV) for the stimulation treatment based on the first and second boundaries;
adjusting an injection plan of the stimulation treatment of the subterranean region based on the identified uncertainty associated with the SRV for the stimulation treatment, wherein the injection plan comprises one or more of an injection schedule of a treatment stage, a parameter of injection treatment, or a diversion technique; and
applying, by a well system, the adjusted injection plan of the stimulation treatment to the subterranean region.

2. The method of claim 1, wherein the first boundary resides wholly within the second boundary.

3. The method of claim 1, further comprising:
computing a third boundary based on the microseismic event locations; and
identifying the SRV based on the third boundary.

4. The method of claim 3, wherein computing the first boundary includes calculating the first boundary based on interior projection points of vertices of the third boundary, the interior projection points residing inside the third boundary, and computing the second boundary includes calculating the second boundary based on exterior projection points of the vertices, the exterior projection points residing outside the third boundary.

5. The method of claim 1, wherein the microseismic events are associated with a single stage in a multi-stage injection treatment, and the uncertainty is associated with the SRV for the single stage.

6. The method of claim 1, wherein the common spatial domain comprises a three-dimensional space and the first and second boundaries are three-dimensional boundaries.

7. The method of claim 1, wherein the common spatial domain comprises a two-dimensional space and the first and second boundaries are two-dimensional boundaries.

8. The method of claim 1, wherein the uncertainty comprises a difference in volume between the first and second boundaries.

9. The method of claim 1, further comprising displaying one or more of the boundaries as geometric objects.

10. The method of claim 9, comprising displaying the one or more boundaries in real time during the stimulation treatment.

11. A non-transitory computer-readable medium storing instructions that, when executed by data processing apparatus, perform operations comprising:
receiving microseismic event data, collected by a microseismic event sensor, associated with a stimulation treatment of a subterranean region, the microseismic event data identifying a plurality of microseismic event locations;
calculating first and second boundaries based on the plurality of microseismic event locations, the first and second boundaries defined in a common spatial domain, at least a portion of the second boundary residing outside the first boundary;
identifying an uncertainty associated with a stimulated reservoir volume (SRV) based on a difference between the first and second boundaries; and
adjusting an injection plan of the stimulation treatment of the subterranean region based on the identified uncertainty associated with the SRV for the stimulation treatment, wherein the injection plan comprises one or more of an injection schedule of a treatment stage, a parameter of injection treatment, or a diversion technique, wherein the adjusted injection plan of the stimulation treatment is applied by a well system to the subterranean region.

12. The computer-readable medium of claim 11, the operations comprising:
calculating a third boundary based on the microseismic event locations; and
identifying the SRV based on the third boundary.

13. The computer-readable medium of claim 12, wherein computing the first boundary includes calculating the first boundary based on interior projection points of vertices of the third boundary, the interior projection points residing inside the third boundary, and computing the second boundary includes calculating the second boundary based on exterior projection points of the vertices, the exterior projection points residing outside the third boundary.

14. The computer-readable medium of claim 12, wherein the common spatial domain comprises a three-dimensional space and the first, second, and third boundaries are three-dimensional boundaries.

15. The computer-readable medium of claim 11, wherein the microseismic events are associated with a single stage in a multi-stage injection treatment, and the uncertainty is associated with the SRV for the single stage.

16. The computer-readable medium of claim 11, wherein the operations further comprise displaying one or more of the boundaries as geometric objects.

17. A well system comprising:
a computing subsystem comprising:
memory operable to store microseismic event data associated with a stimulation treatment of a subterranean region; and
data processing apparatus operable to:
compute first and second boundaries based on locations of microseismic events, the first and second boundaries defined in a common spatial domain, at least a portion of the second boundary residing outside the first boundary;
identify an uncertainty associated with a stimulated reservoir volume (SRV) based on a difference between the first and second boundaries; and
adjust an injection plan of the stimulation treatment of the subterranean region based on the identified uncertainty associated with the SRV for the stimulation treatment, wherein the injection plan comprises one or more of an injection schedule of a treatment stage, a parameter of injection treatment, or a diversion technique; and
an injection system operable to apply the adjusted injection plan of the stimulation treatment to the subterranean region.

18. The well system of claim 17, the data processing apparatus further operable to:
calculate a third boundary based on the microseismic event locations; and
identify the SRV based on the third boundary.

19. The well system of claim 18, the data processing apparatus being operable to:
calculate the first boundary based on respective interior projection points of vertices of the third boundary, the interior projection points residing inside the third boundary; and
calculate the second boundary based on respective exterior projection points of the vertices, the exterior projection points residing outside the third boundary.

20. The well system of claim 17, comprising a display operable to display one or more of the boundaries as geometric objects.

21. The well system of claim 20, wherein the display is operable to display the one or more of the boundaries in real time during the stimulation treatment.

22. The well system of claim 17, comprising a communication interface operable to receive the microseismic event data during the stimulation treatment.

* * * * *

UNITED STATES PATENT AND TRADEMARK OFFICE
CERTIFICATE OF CORRECTION

PATENT NO. : 9,551,208 B2
APPLICATION NO. : 14/010023
DATED : January 24, 2017
INVENTOR(S) : Jianfu Ma, Avi Lin and Harold Grayson Walters It is certified that error appears in the above-identified patent and that said Letters Patent is hereby corrected as shown below:

In the Specification

In Column 23, Line 65, delete formula "$R_y = \begin{bmatrix} \cos\theta_y & 0 & \sin\theta_y \\ 0 & 1 & 0 \\ -\sin\theta_y & 0 & \cos\theta_x \end{bmatrix},$"

and insert -- $R_y = \begin{bmatrix} \cos\theta_y & 0 & \sin\theta_y \\ 0 & 1 & 0 \\ -\sin\theta_y & 0 & \cos\theta_y \end{bmatrix},$ (18-c) --

In Column 25, Line 59, delete "$c = \frac{1}{\sqrt{\lambda_3}}.$ (26-c)" and insert -- $c = \frac{1}{\sqrt{\lambda_3}}.$ (27-c) --

Signed and Sealed this
Tenth Day of October, 2017

Joseph Matal
*Performing the Functions and Duties of the*
*Under Secretary of Commerce for Intellectual Property and*
*Director of the United States Patent and Trademark Office*